US011339498B2

United States Patent
Choi et al.

(10) Patent No.: US 11,339,498 B2
(45) Date of Patent: May 24, 2022

(54) METHOD FOR GROWING SINGLE CRYSTAL SILICON CARBIDE INGOT HAVING LARGE DIAMETER

(71) Applicant: SENIC Inc., Chungcheongnam-do (KR)

(72) Inventors: Jung Woo Choi, Gyeonggi-do (KR);
Kap-Ryeol Ku, Gyeonggi-do (KR);
Jung-Gyu Kim, Gyeonggi-do (KR)

(73) Assignee: Senic Inc., Chungcheongnam-do (KR)

( * ) Notice: Subject to any disclaimer, the term of this patent is extended or adjusted under 35 U.S.C. 154(b) by 320 days.

(21) Appl. No.: 16/470,849

(22) PCT Filed: Dec. 20, 2017

(86) PCT No.: PCT/KR2017/015132
§ 371 (c)(1),
(2) Date: Jun. 18, 2019

(87) PCT Pub. No.: WO2018/117645
PCT Pub. Date: Jun. 28, 2018

(65) Prior Publication Data
US 2020/0255973 A1     Aug. 13, 2020

(30) Foreign Application Priority Data

Dec. 20, 2016 (KR) .................. 10-2016-0174631
Nov. 29, 2017 (KR) .................. 10-2017-0161489
Nov. 29, 2017 (KR) .................. 10-2017-0161520

(51) Int. Cl.
*C30B 23/02* (2006.01)
*C30B 29/36* (2006.01)

(52) U.S. Cl.
CPC ............ *C30B 23/025* (2013.01); *C30B 29/36* (2013.01)

(58) Field of Classification Search
CPC .................... C30B 23/025; C30B 29/36
See application file for complete search history.

(56) References Cited

U.S. PATENT DOCUMENTS 4,643,956 A * 2/1987 Sandelli .............. H01M 8/0213
429/509
2002/0083892 A1   7/2002 Kondo et al.
(Continued)

FOREIGN PATENT DOCUMENTS

CN      101985773 B    12/2013
CN      103603037      2/2014
(Continued)

OTHER PUBLICATIONS

Extended Search Report issued by the European Patent Office dated Jan. 12, 2021.
(Continued)

*Primary Examiner* — Matthew J Song
(74) *Attorney, Agent, or Firm* — IP & T Group LLP

(57) ABSTRACT

A method in which a carbonaceous protective film is formed on a rear surface of a single crystal SiC seed, the seed is placed in a reaction container without adhesion, and then single crystal SiC is grown from a SiC raw material on a front surface of the seed allows the seed to grow to a single crystal ingot having a large diameter since the absence of adhesion of the seed to a holder prevents the generation of warps or cracks attributed to a difference in thermal expansion coefficient between the seed and the holder during heating.

9 Claims, 15 Drawing Sheets

(56) References Cited

U.S. PATENT DOCUMENTS

| | | | | |
|---|---|---|---|---|
| 2013/0068157 A1* | 3/2013 | Sasaki | ................... | C23C 14/24 |
| | | | | 117/84 |
| 2013/0171403 A1* | 7/2013 | Straubinger | ............ | C30B 29/36 |
| | | | | 428/66.7 |
| 2014/0220296 A1* | 8/2014 | Loboda | ................ | C30B 23/005 |
| | | | | 428/131 |
| 2015/0068446 A1* | 3/2015 | Drachev | ................ | C30B 23/00 |
| | | | | 117/84 |

FOREIGN PATENT DOCUMENTS

| | | |
|---|---|---|
| CN | 105008596 A | 10/2015 |
| CN | 105696069 | 6/2016 |
| JP | 2001-114599 | 4/2001 |
| JP | 2002-201097 A | 7/2002 |
| JP | 2004-269297 | 9/2004 |
| JP | 2011-006302 A | 1/2011 |
| KR | 10-2012-0022791 | 3/2012 |
| KR | 10-2012-0121454 | 11/2012 |
| KR | 10-2014-0087344 | 7/2014 |
| KR | 10-2015-0075220 | 7/2015 |
| KR | 10-2015-0076271 | 7/2015 |
| KR | 10-1538556 | 7/2015 |
| WO | 2016/163157 A1 | 10/2016 |

OTHER PUBLICATIONS

Office Action issued by Chinese Patent Office dated Oct. 22, 2020.
Sanchez, E. K. et al., Formation of Thermal Decomposition Cavities in Physical Vapor Transport of Silicon Carbide, Journal of Electronic Materials, 2000, pp. 347-352, vol. 29, No. 3.
Office Action for Korean Patent Application No. 10-2017-0161489 issued by the Korean Intellectual Property Office dated Jun. 25, 2019.
Office Action for Korean Patent Application No. 10-2017-0161520 issued by the Korean Intellectual Property Office dated Jun. 25, 2019.
Office Action issued by the Korean Intellectual Property Office dated Aug. 25, 2017.
Office Action issued by the Korean Intellectual Property Office dated Dec. 13, 2018.
Office Action issued by Japanese Patent Office dated Jun. 30, 2020.

* cited by examiner

[Fig. 1A]
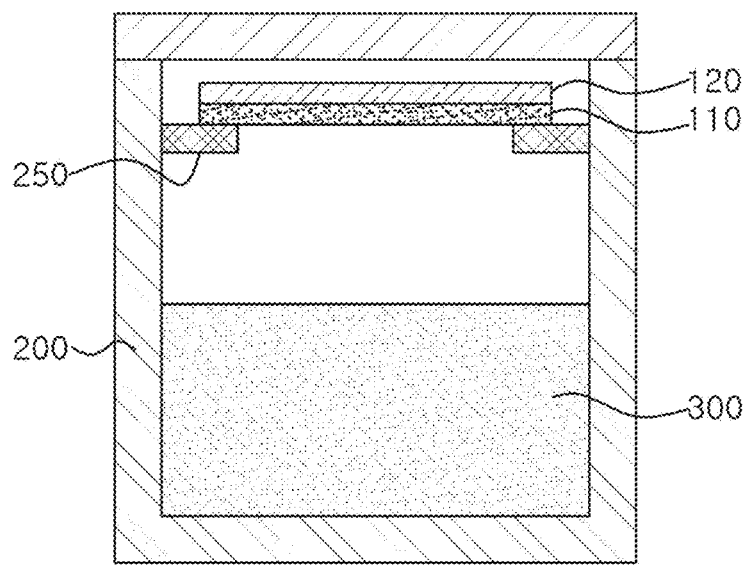
[Fig. 1B]
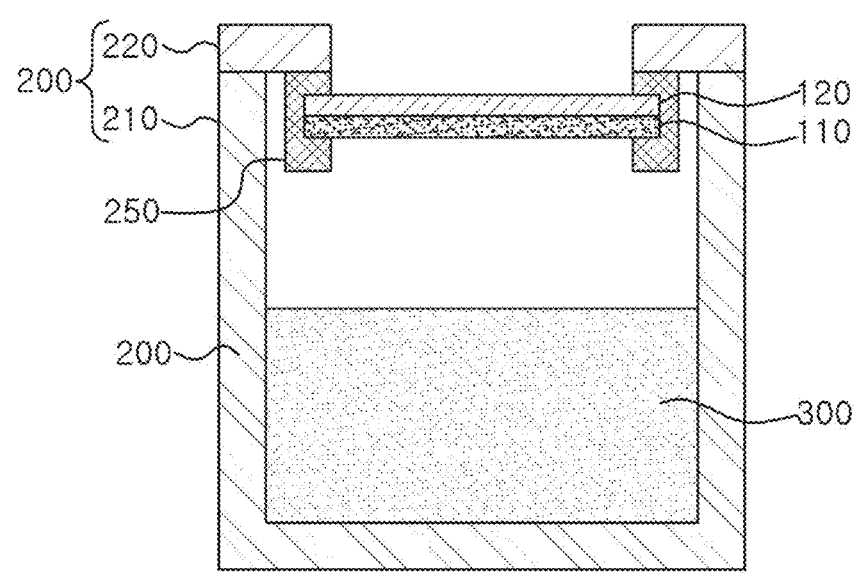

[Fig. 2]
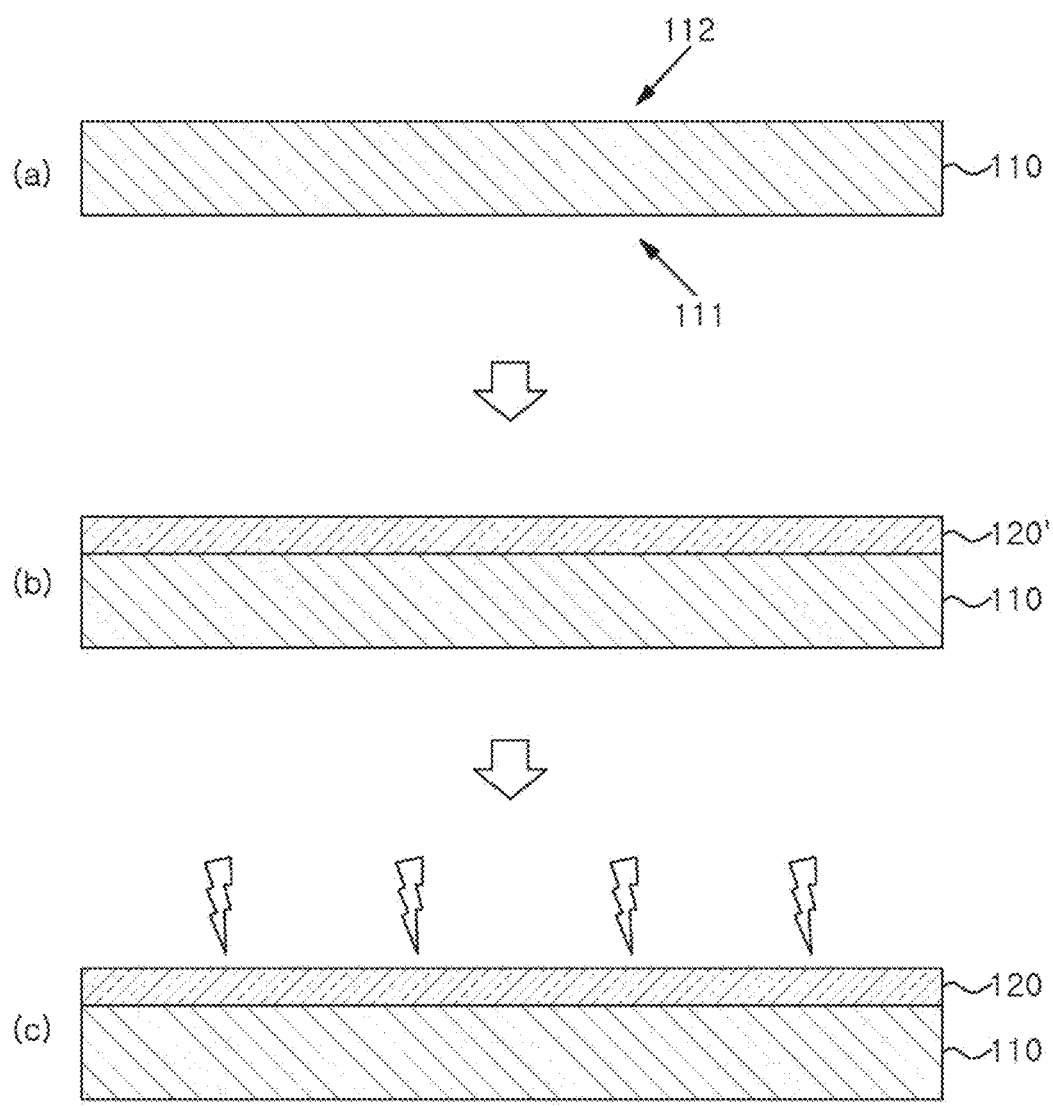

[Fig. 3A]
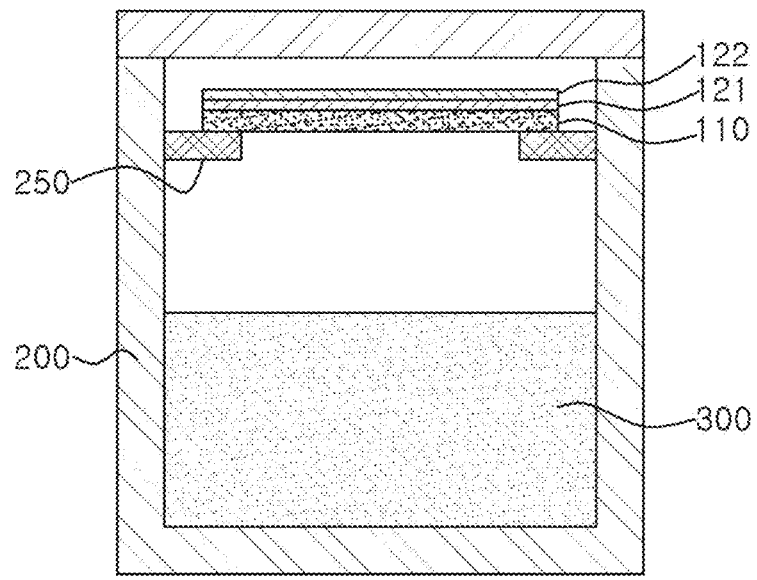
[Fig. 3B]
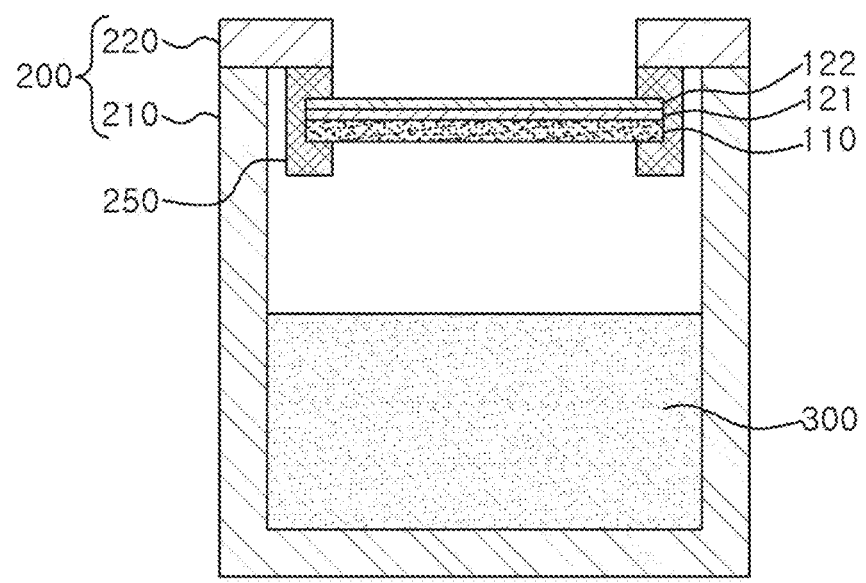

[Fig. 4]
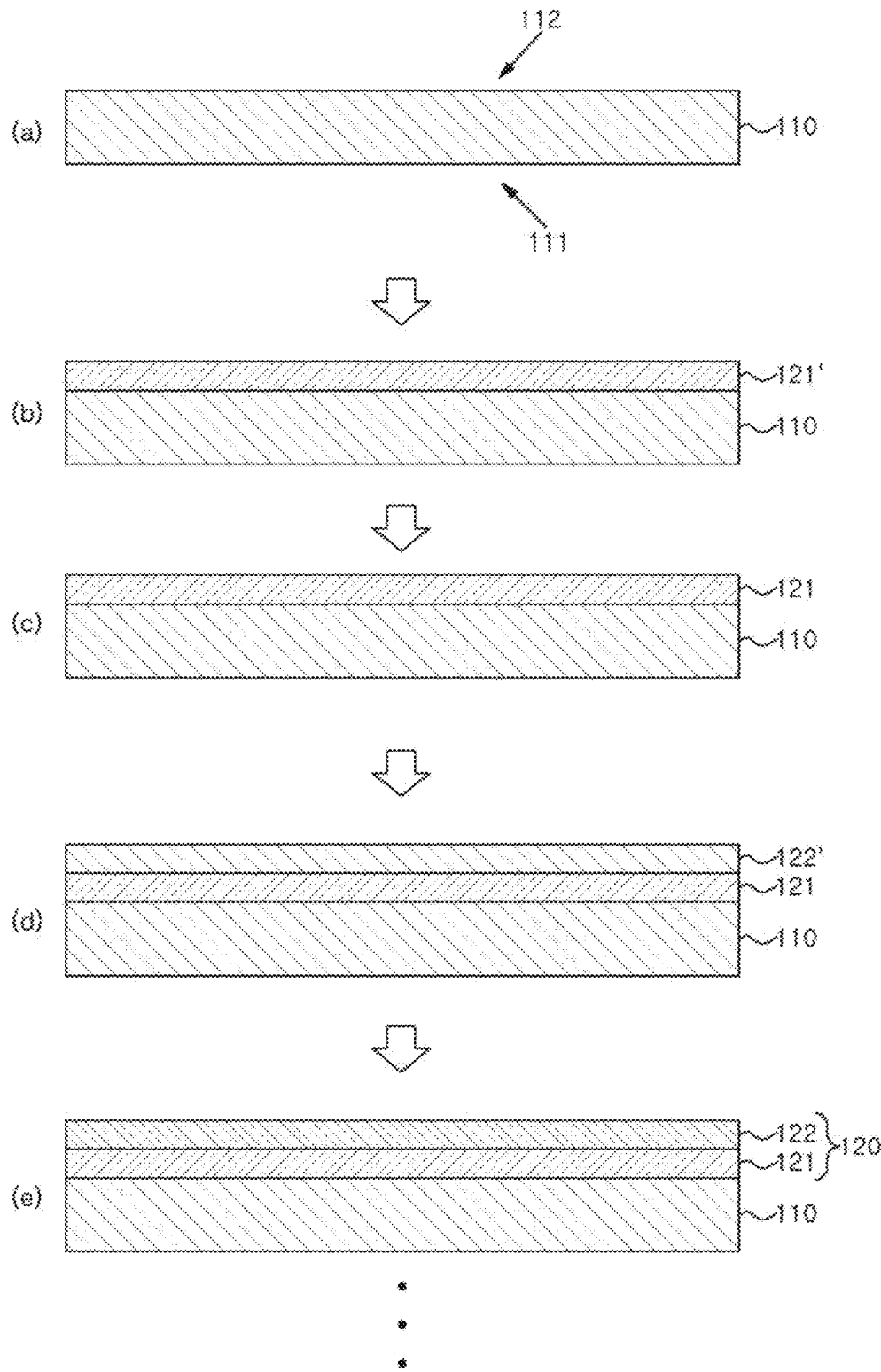

[Fig. 5A]
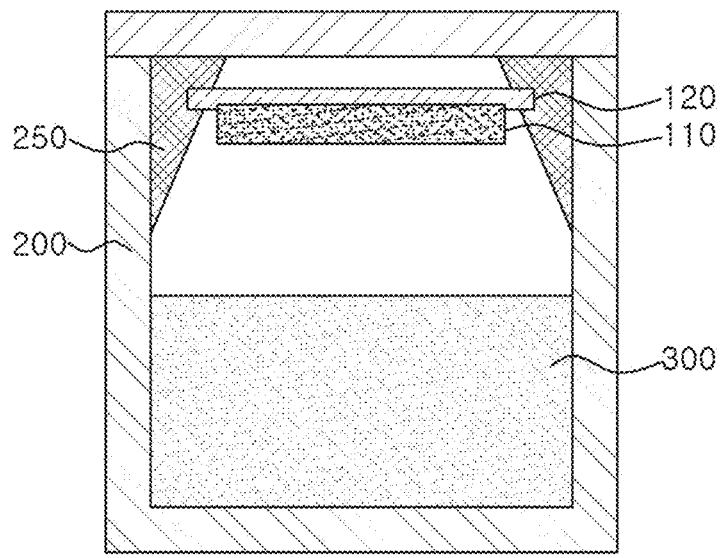
[Fig. 5B]
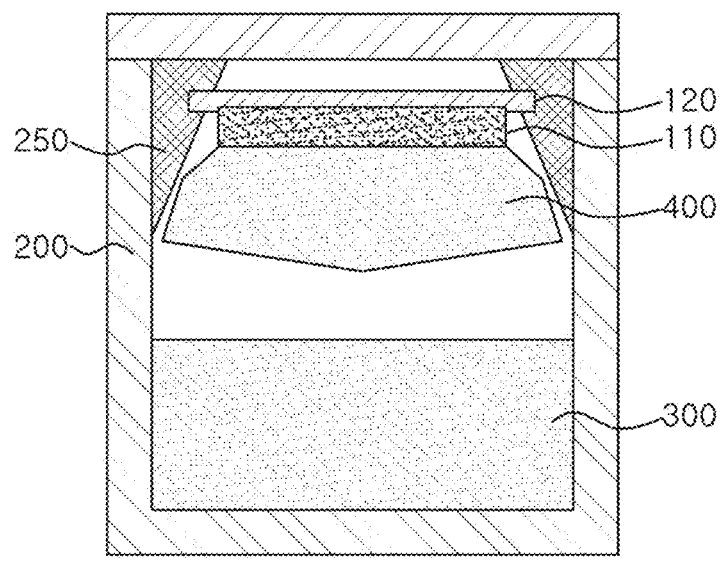

[Fig. 6A]
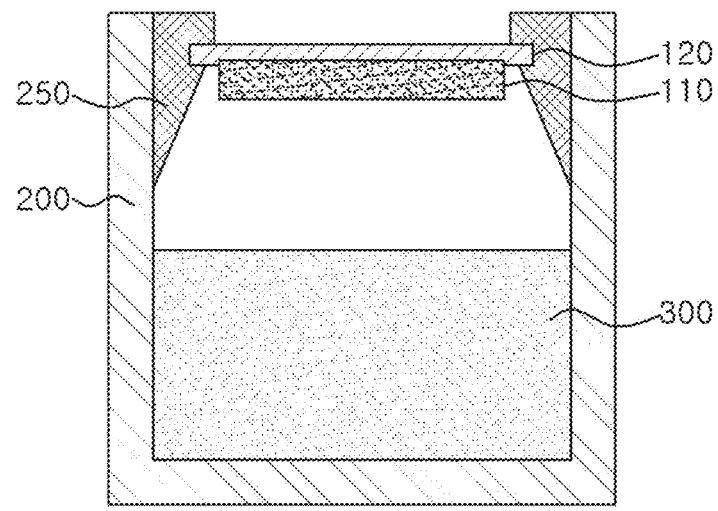
[Fig. 6B]
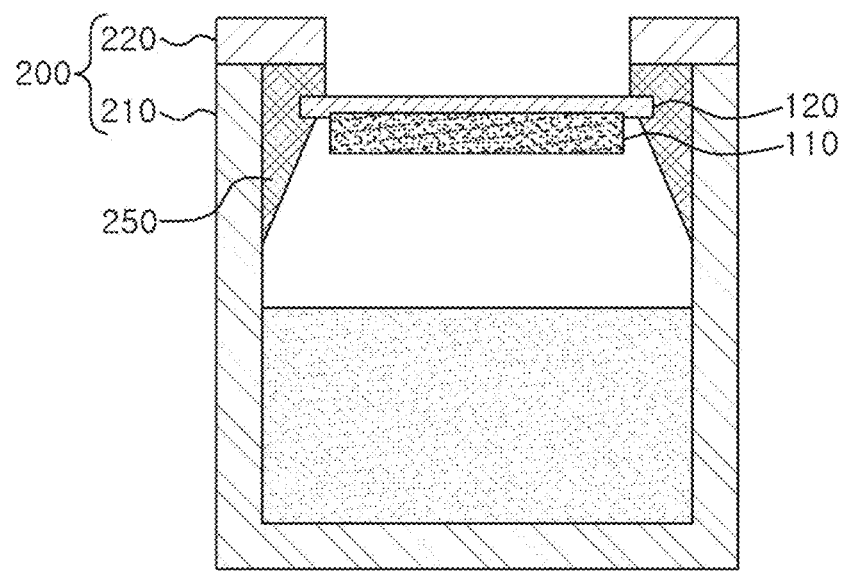

[Fig. 7A]
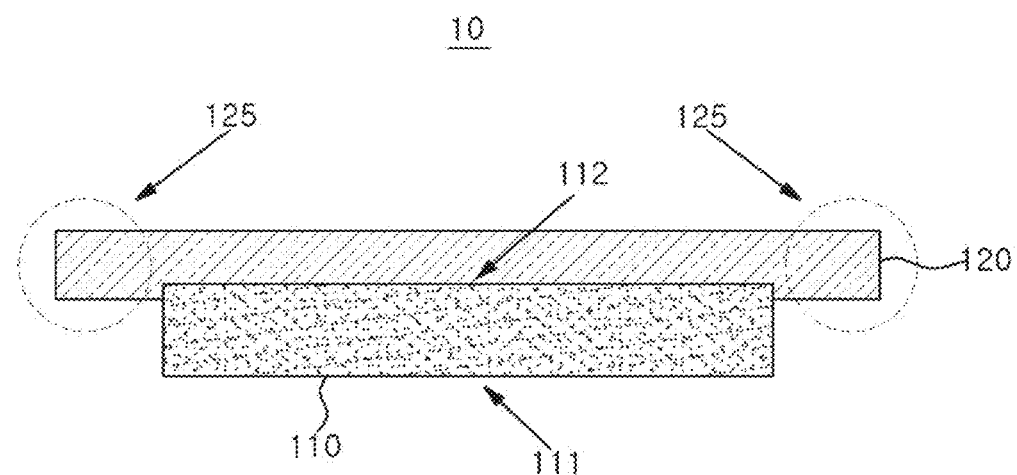
[Fig. 7B]
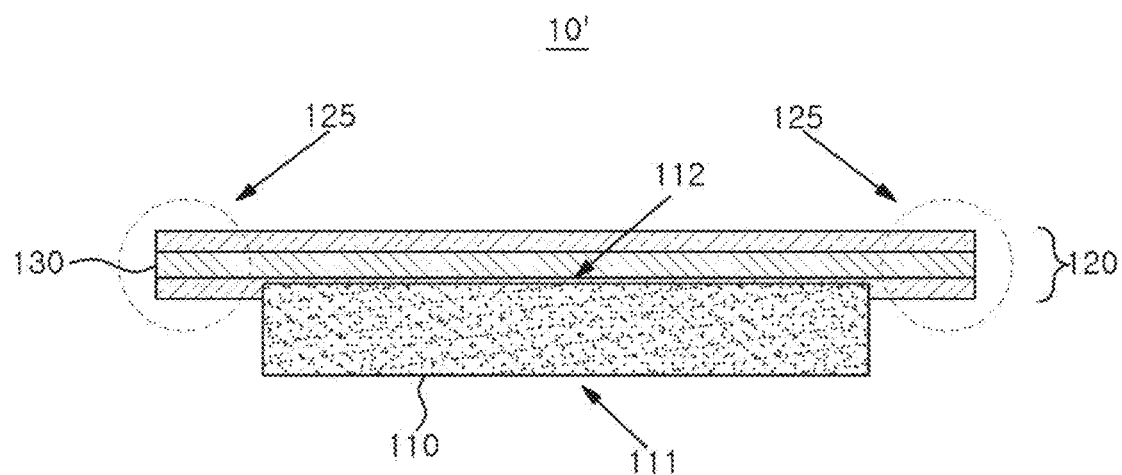

[Fig. 8]
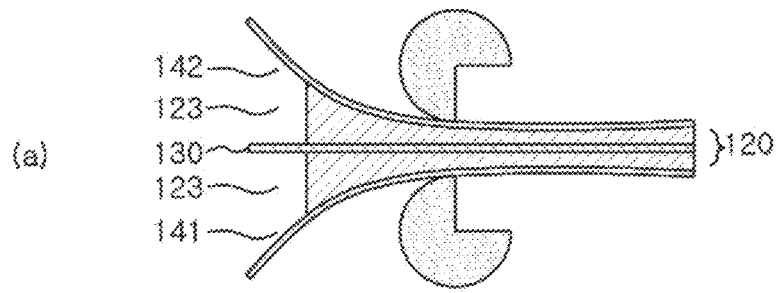
(a)
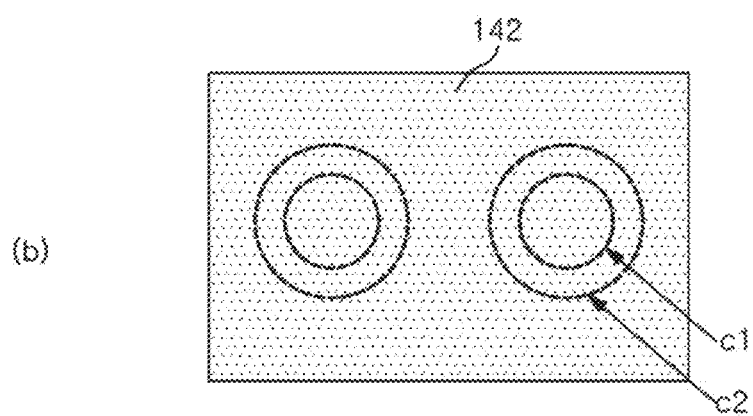
(b)
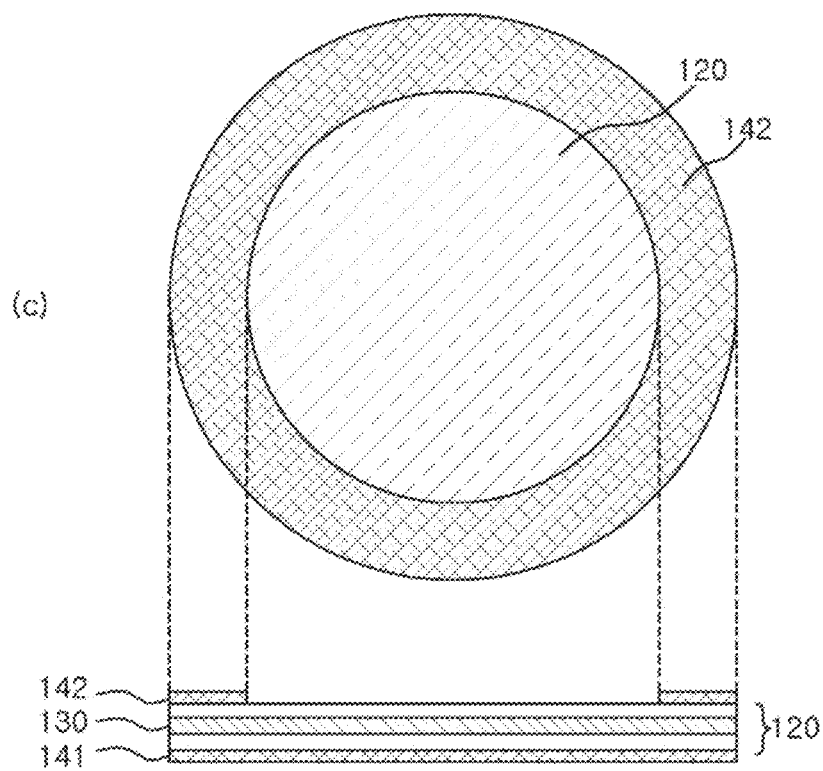
(c)

[Fig. 9]
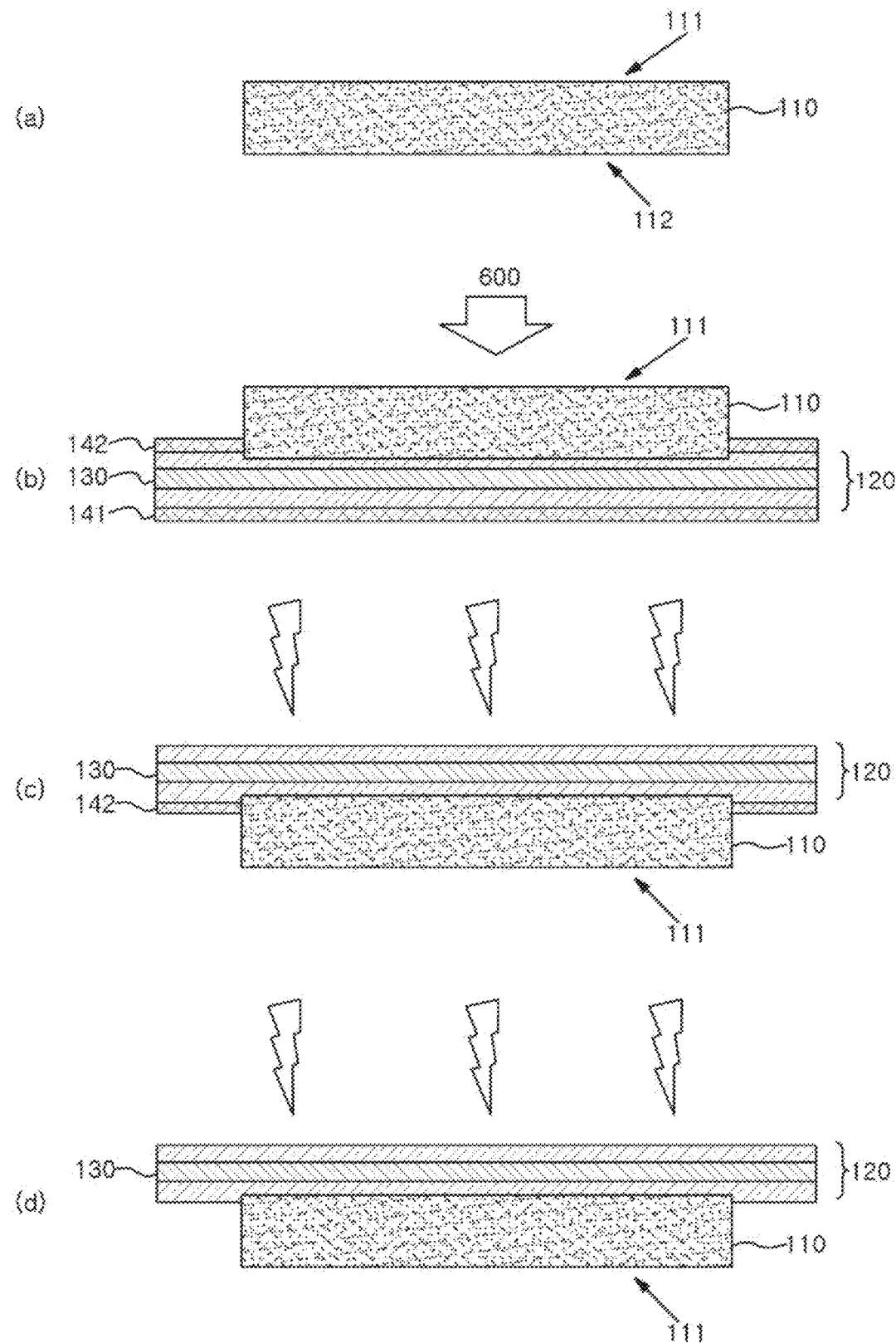

[Fig. 10A]
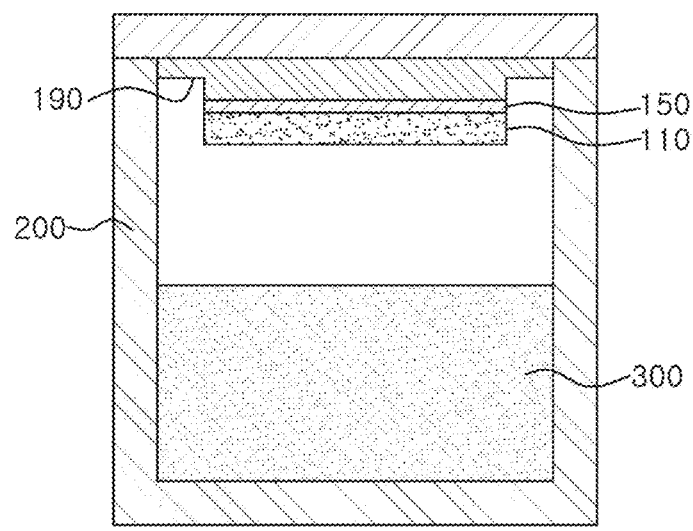
[Fig. 10B]
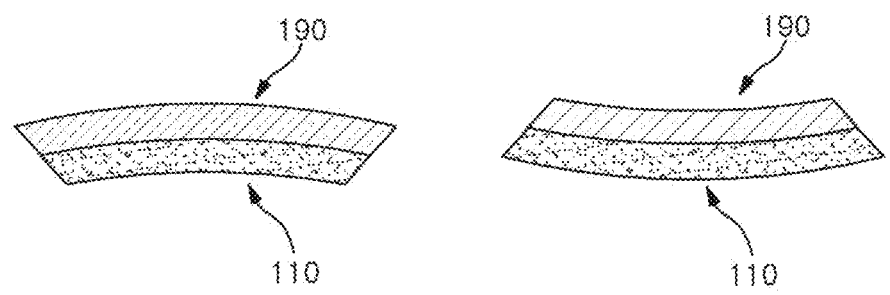

[Fig. 11A]
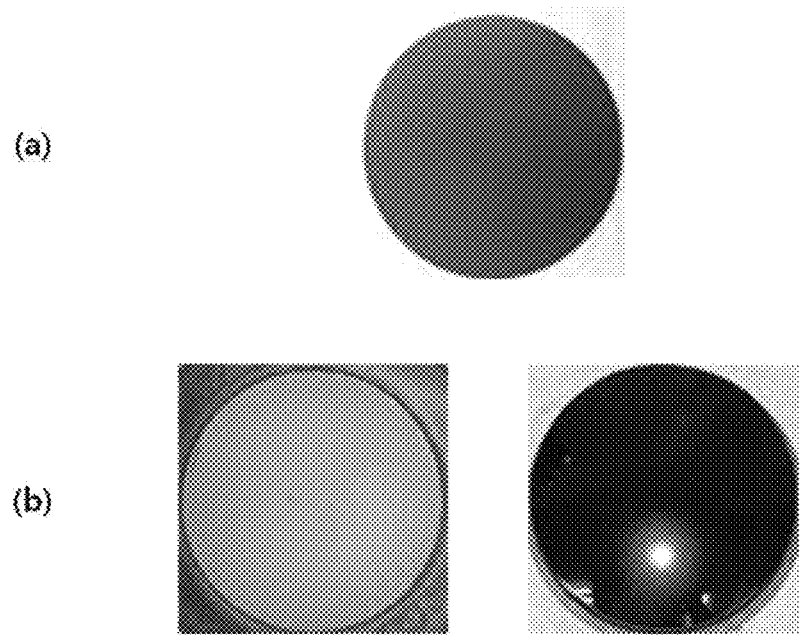
[Fig. 11B]
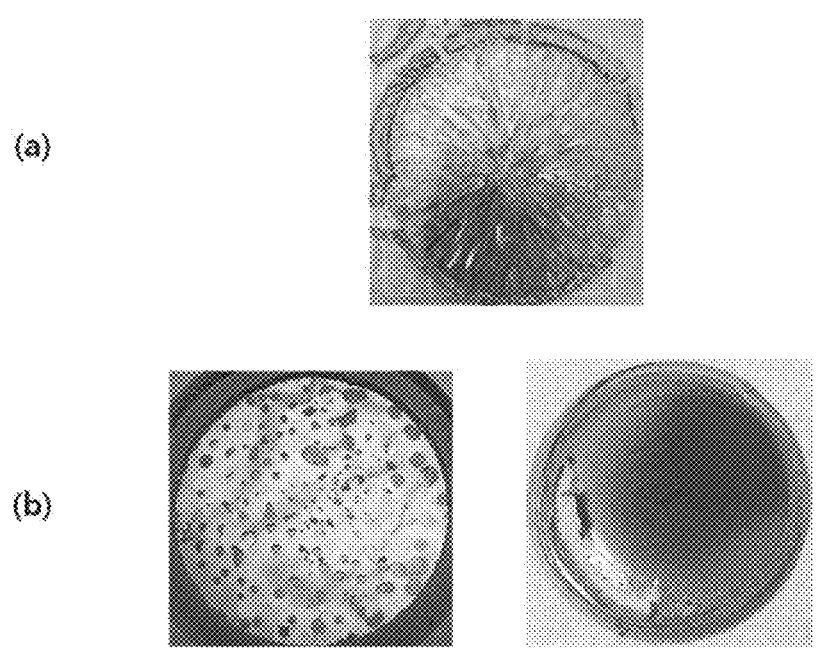

[Fig. 12A]
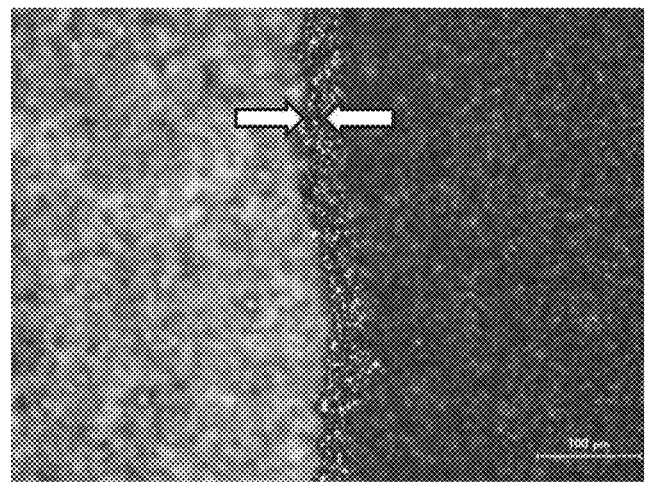
[Fig. 12B]
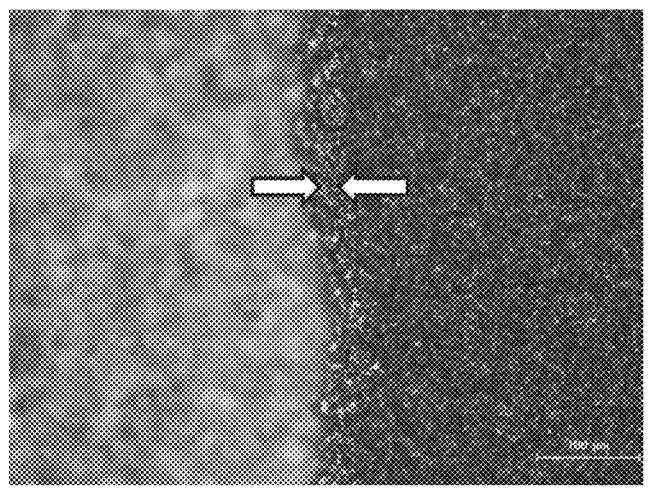
[Fig. 12C]
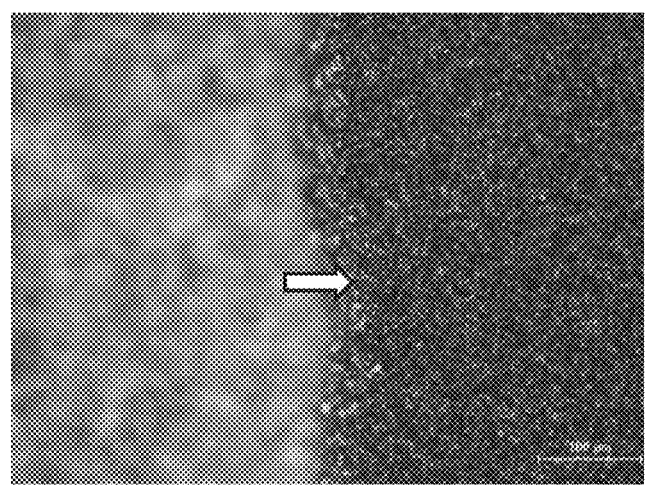

[Fig. 13]
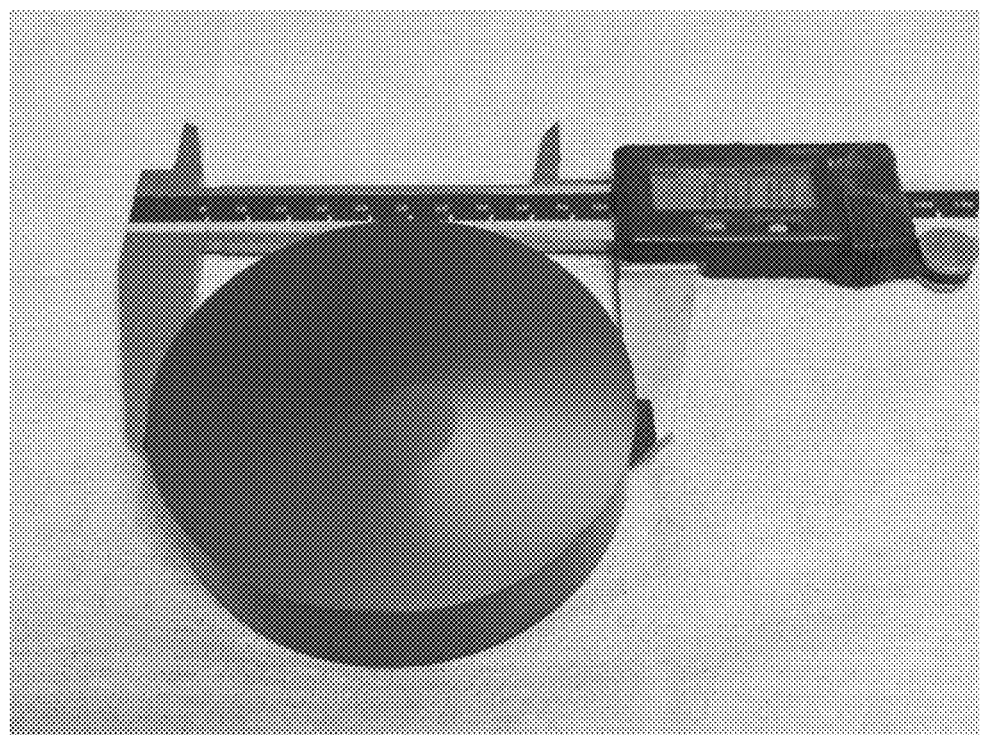

[Fig. 14A]
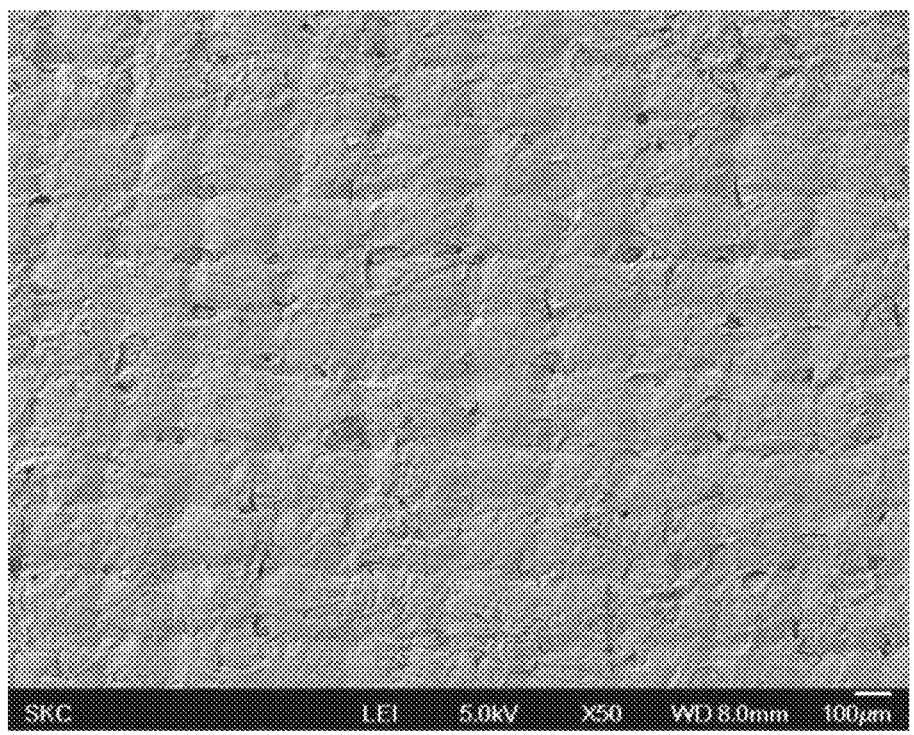
[Fig. 14B]
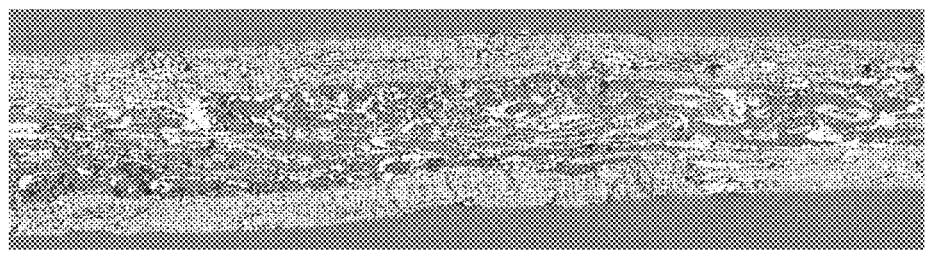

[Fig. 15A]
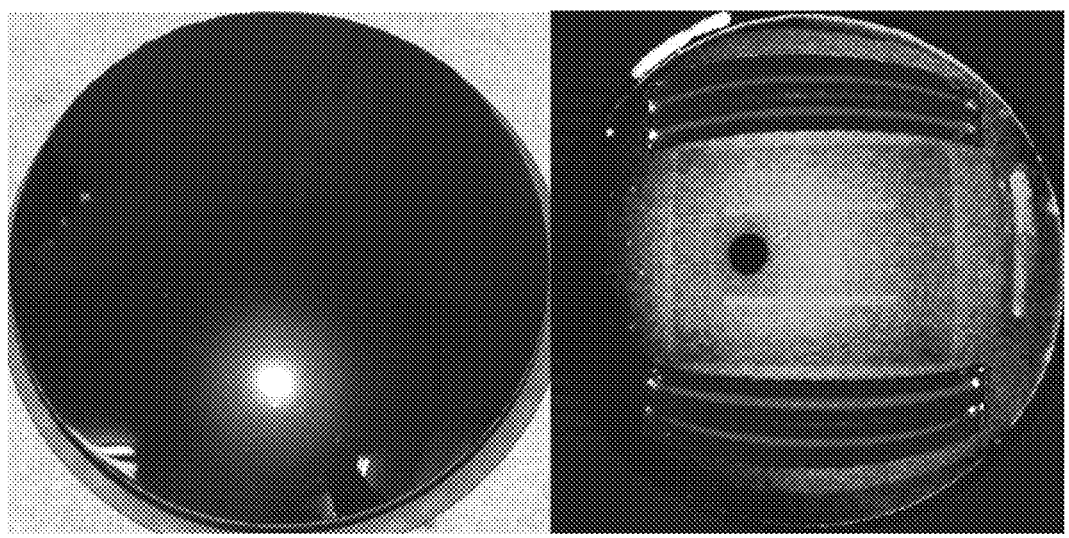
[Fig. 15B]
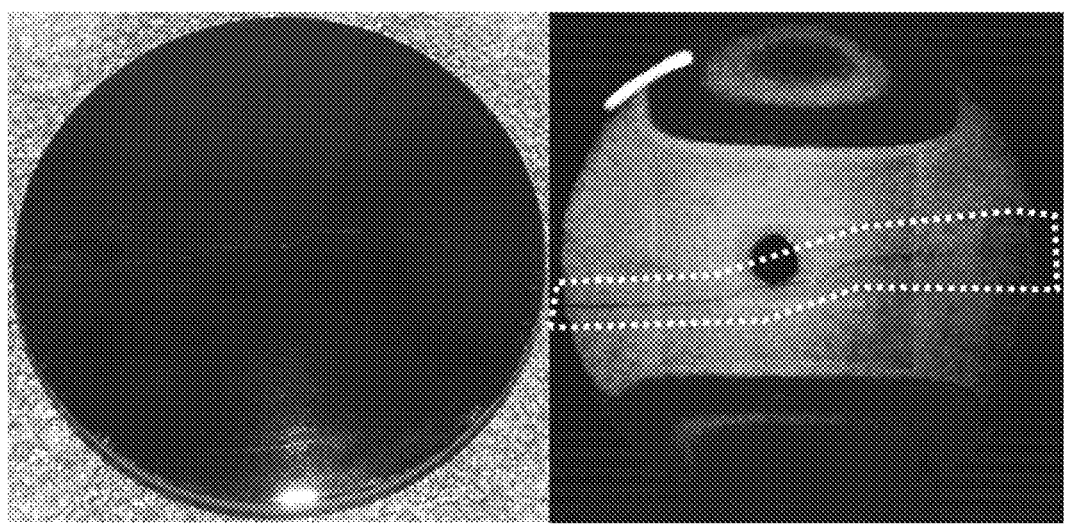

METHOD FOR GROWING SINGLE CRYSTAL SILICON CARBIDE INGOT HAVING LARGE DIAMETER

This application is a national stage application of PCT/KR2017/015132 filed on Dec. 20, 2017, which claims priority of Korean patent application number 10-2016-0174631 filed on Dec. 20, 2016 and Korean patent application number 10-2017-0161489 and 10-2017-0161520 filed on Nov. 29, 2017. The disclosure of each of the foregoing applications is incorporated herein by reference in its entirety.

TECHNICAL FIELD

The following embodiments relate to a process for growing a silicon carbide (SiC) single crystal ingot from a silicon carbide raw material and a seed crystal used therefor.

More specifically, the embodiments relate to a process for growing an SiC single crystal ingot having a large diameter from an SiC raw material on a seed crystal and a seed crystal used therefor that is provided with a protective layer.

BACKGROUND ART

A single crystal of silicon carbide (SiC), silicon (Si), gallium nitride (GaN), sapphire ($Al_2O_3$), gallium arsenide (GaAs), aluminum nitride (AlN), or the like has characteristics that cannot be expected from a polycrystal counterpart thereof. Thus, a demand therefor in the industries is increasing.

In particular, single crystal silicon carbide (SiC) has a large energy band gap and is excellent in maximum break field voltage and thermal conductivity as compared with silicon (Si). In addition, the carrier mobility of single crystal silicon carbide is comparable to that of silicon, and the saturation drift rate of electrons and the breakdown voltage thereof are large as well. By virtue of such characteristics, single crystal silicon carbide is expected to be applied to semiconductor devices that require high efficiency, high breakdown voltage, and large capacity.

As a method for preparing such a single crystal, for example, Japanese Laid-open Patent Publication No. 2001-114599 discloses a method of growing a single crystal ingot on a seed crystal by maintaining the seed crystal at a temperature lower than that of a raw material powder by 10 to 100° C. while heating it with a heater in a vacuum container (or a heating furnace) capable of introducing argon gas.

In order to grow a single crystal ingot, a step of adhering a seed crystal is generally carried out in advance. For example, in a conventional process referring to FIG. 10A, an adhesive (150) is applied between a seed crystal holder (190) and a seed crystal (110), which are pressed to adhere the seed crystal. Thereafter, a raw material (300) is heated and sublimated in a reaction vessel (200), whereby a single crystal ingot is grown on the front side of the seed crystal (110).

DISCLOSURE OF INVENTION

Technical Problem

In the conventional process in which a seed crystal is adhered to a holder located in an upper region of a reaction vessel, a difference in the coefficient of thermal expansion (CTE) between the seed crystal and the holder causes a warp (see FIG. 10B) or cracks due to the residual stress in the heating process. This phenomenon is further aggravated as the diameter of the single crystal ingot becomes larger as it grows, which makes it difficult to grow a single crystal ingot having a large diameter.

In addition, in the conventional process in which a seed crystal is adhered to a holder located in an upper region of a reaction vessel with an adhesive, there have been problems such as deterioration in quality during the growth of the single crystal ingot due to the adhesive, detachment of the seed crystal, contamination of the surface of the seed crystal, and the like.

Accordingly, the following embodiments aim to provide a process for growing a single crystal ingot without adhesion of a seed crystal to a holder, thereby growing an SiC single crystal ingot having a large diameter and high quality.

In addition, the embodiments aim to provide a seed crystal provided with a protective layer for use in the above process and a process for preparing the same.

Solution to Problem

According to an embodiment, there is provided a process for growing a silicon carbide (SiC) single crystal ingot, which comprises (1) forming a carbonaceous protective layer on the rear side of a seed crystal of an SiC single crystal; (2) charging an SiC raw material to a lower region of a reaction vessel and placing the seed crystal on an upper region of the reaction vessel without adhesion thereto; and (3) growing an SiC single crystal ingot on the front side of the seed crystal from the SiC raw material.

According to another embodiment, there is provided a process for preparing a seed crystal of a silicon carbide (SiC) single crystal provided with a protective layer, which comprises forming a carbonaceous protective layer on the rear side of the seed crystal of an SiC single crystal.

According to still another embodiment, there is provided a seed crystal provided with a protective layer, which comprises a seed crystal of an SiC single crystal and a carbonaceous protective layer formed on the rear side of the seed crystal.

Advantageous Effects of Invention

According to the embodiment, an SiC single crystal ingot is grown without attaching a seed crystal to a holder. Since no warp or cracks due to the residual stress caused by a difference in the thermal expansion coefficient between the single crystal ingot and the holder would be generated in the heating process, it is possible to grow a single crystal ingot having a large diameter.

In addition, according to the embodiment, it is not necessary to apply an adhesive to a seed crystal. Thus, it is possible to prevent deterioration in quality caused by the adhesive.

In addition, according to the embodiment, a carbonaceous protective layer is formed on the rear side of a seed crystal. Thus, it is possible to prevent loss of the rear side of the seed crystal that may otherwise occur during the heating for the growth thereof.

BRIEF DESCRIPTION OF DRAWINGS

FIGS. 1A and 1B show the configurations of a reaction vessel for preparing a SiC single crystal ingot according to a specific embodiment.

FIG. 2 shows a method of forming a protective layer on a seed crystal according to a specific embodiment.

FIGS. 3A and 3B show the configurations of a reaction vessel for preparing a SiC single crystal ingot according to another specific embodiment.

FIG. 4 shows a method of forming a protective layer on a seed crystal according to another specific embodiment.

FIGS. 5A, 6A, and 6B show the configurations of a reaction vessel for preparing a SiC single crystal ingot according to still another specific embodiment.

FIG. 5B shows a method of growing an SiC single crystal ingot according to still another specific embodiment.

FIGS. 7A and 7B show a cross-section of a seed crystal provided with a protective layer according to still another specific embodiment.

FIG. 8 shows a method of forming a protective layer according to still another specific embodiment.

FIG. 9 shows a method of attaching a protective layer to a seed crystal according to still another specific embodiment.

FIG. 10A shows the configuration of a reaction vessel for preparing a SiC single crystal ingot according to a conventional process.

FIG. 10B shows warp due to a difference in the coefficient of thermal expansion between a seed crystal holder and a seed crystal.

FIGS. 11A and 11B are each a photograph of the surface of a protective layer provided on the seed crystals prepared in Example B1 and Comparative Example B1.

FIGS. 12A to 12C are microscopic images of the first carbonaceous layer, the second carbonaceous layer, and the third carbonaceous layer, respectively, observed on a cross-section of the seed crystal provided with a protective layer prepared in Example B 1.

FIG. 13 is a photograph of the SiC single crystal ingot prepared in Example B2.

FIGS. 14A and 14B are microscopic images showing the surface and the cross-section of a protective layer prepared in Example C 1, respectively.

FIGS. 15A and 15B are photographs of the SiC single crystal ingots prepared in Example C2 and the Comparative Example, respectively.

<Reference Numerals of the Drawings>

| | |
|---|---|
| 10, 10': seed crystal provided with a protective layer | |
| 110: seed crystal | 111: front side of a seed crystal |
| 112: rear side of a seed crystal | 120: protective layer |
| 120': coating layer | 121: first carbonaceous layer |
| 121': first coating layer | 122: second carbonaceous layer |
| 122': second coating layer | 123: composition for a protective layer |
| 125: protrusion member | 130: core layer |
| 141: first release film | 142: second release film |
| 150: adhesive | 190: seed crystal holder |
| 200: reaction vessel | 210: body of a reaction vessel |
| 220: open-type lid | 250: rack |
| 300: raw material | 400: SiC ingot |
| c1, c2: cutting line. | |

DETAILED DESCRIPTION FOR CARRYING OUT THE INVENTION

Hereinafter, the embodiments will be described in detail with reference to the accompanying drawings. In the following detailed description, the positions referred to as upper or lower are to be understood with reference to the drawings. The drawings referred to in the following description may be exaggerated in size, spacing, and the like for the sake of description. In addition, what is obvious to a person of ordinary skill in the art may be omitted in the following description.

<Process for Preparing a Seed Crystal Provided with a Protective Layer>

The process for preparing a seed crystal provided with a protective layer according to an embodiment comprises forming a carbonaceous protective layer on the rear side of the seed crystal of an SiC single crystal.

Specific Embodiment A

The process for preparing a seed crystal provided with a protective layer according to a specific embodiment comprises (a1) preparing a composition that comprises a binder resin and a filler; and (a2) coating the composition on the rear side of a seed crystal of an SiC single crystal and thermally treating the coated composition to form a carbonaceous protective layer, wherein the carbonaceous protective layer has a thickness of 5 to 1,000 μm, and the filler is a carbon-based filler, a metal-based filler, or a composite filler thereof.

According to the specific embodiment, the filler added in the preparation of a carbonaceous protective layer prevents cracks or the like that may be generated in the protective layer during the thermal treatment.

Each step will be described in detail below.

(a1) Preparation of a Coating Composition

In the above step (a1), a composition that comprises a binder resin and a filler is prepared.

The binder resin is the main component of a coating layer for the preparation of a protective layer. The binder resin may be, for example, a phenolic resin, a polyacrylonitrile resin, a pitch-based resin, a polyvinyl chloride resin, a polyacrylic acid resin, a furan-based resin, an epoxy-based resin, or a mixed resin thereof.

It is preferable that the binder resin has a high actual carbon ratio. For example, the binder resin may have an actual carbon ratio of 5 to 50% or 10 to 30% in an inert gas atmosphere.

In addition, the binder resin is preferably a curable resin. For example, it may be a thermosetting resin.

The filler serves to promote carbonization or graphitization during the thermal treatment after the formation of a coating layer and to prevent cracks from being generated due to an excessive shrinkage.

The filler may be, for example, a carbon-based filler, a metal-based filler, or a composite filler thereof. Specifically, the filler may comprise a component such as flake graphite, amorphous graphite, expanded graphite, carbon black, carbon nanotubes, graphene, tantalum (Ta), tungsten (W), rhenium (Re), molybdenum (Mo), hafnium (Hf), tantalum carbide (TaC), tungsten carbide (WC), and the like.

The filler may be employed in an amount of 5 to 95% by weight, 5 to 60% by weight, 10 to 50% by weight, or 20 to 40% by weight, based on the total weight of the composition. As another example, the filler may be employed in the composition in an amount of 10 to 200 parts by weight or 30 to 150 parts by weight per 100 parts by weight of the binder resin. If the content of the filler is within the above preferable ranges, it may be more advantageous in preventing shrinkage and cracks, which may be generated during the thermal treatment after the formation of a coating layer, to thereby form a protective layer having an excellent surface.

The composition is preferably a liquid composition for the efficiency of coating.

Thus, the composition may comprise a solvent such as ethanol, methanol, acetone, dimethylformamide (DMF), dimethylsulfoxide (DMSO), and the like. In such event, the solids content of the liquid composition may be 10 to 90% by weight or 20 to 50% by weight.

The composition may further comprise a wetting dispersant, a defoaming agent, or the like.

(a2) Formation and Thermal Treatment of a Coating Layer

In the above step (a2), the composition prepared in the previous step is coated on the rear side of a seed crystal of an SiC single crystal, which is then thermally treated to form a carbonaceous protective layer.

Specifically, as shown in FIG. 2, the composition is coated on the rear side (112) of a seed crystal (110) of an SiC single crystal to obtain a coating layer (120'), which is then carbonized or graphitized by thermal treatment to form a carbonaceous protective layer (120).

In this specification, the "front side" of a seed crystal refers to one of the two sides of the seed crystal generally having a wide and flat shape on which a single crystal ingot grows. On the other hand, the "rear side" of a seed crystal refers to the opposite side of the seed crystal to the side on which a single crystal ingot grows.

In a conventional process, an adhesive is applied to the rear side of a seed crystal, which is then attached to a holder. According to the embodiment, however, a protective layer is formed on the rear side of a seed crystal, which is not attached to a holder.

As the seed crystal, any seed crystal having various crystal structures such as 4H—SiC, 6H—SiC, 3C—SiC, and 15R—SiC may be used depending on the kind of crystals to be grown.

The seed crystal may be subjected to cleaning prior to the coating. A silicon dioxide layer may be formed on the surface of a seed crystal by a reaction of silicon with oxygen. It is preferable that such an oxide layer is removed in advance by cleaning since it may have the seed crystal detached or may cause defects when a single crystal ingot is grown in the subsequent process. The cleaning may be carried out with acetone, alcohol, distilled water, an acid solution, or the like, and may be carried out by ultrasonic treatment or immersion. It may be performed once, twice, or more.

Thereafter, the coating is carried out on the rear side of the seed crystal.

A conventional coating method such as spin coating and tape casting may be used for the coating.

In addition, the coating may be carried out in a thickness range of 10 to 2,000 μm or in a thickness range of 20 to 1,500 μm. If the coating thickness is too smaller than the above preferable range, there is a possibility that the protective layer upon the thermal treatment may not serve as a protective layer. On the other hand, if it is too large, bubbles or cracks may be generated, or the coating layer may be peeled off, upon the thermal treatment.

Thereafter, the coating layer is dried and cured at a temperature of 30 to 300° C. or at a temperature of 50 to 200° C., followed by thermal treatment at a temperature of 300° C. or higher, for example, 300 to 2,200° C. to form a carbonaceous protective layer through carbonization thereof.

The binder resin contained in the composition is carbonized or graphitized by the thermal treatment to form a carbonaceous protective layer. In addition, the filler in the coating layer may prevent cracks that may be generated during the thermal treatment and promote the carbonization or graphitization.

The temperature of thermal treatment may be 400° C. or higher, 500° C. or higher, or 600° C. or higher, for example, 400 to 1,500° C., 500 to 1,000° C., 1,500 to 2,500° C., or 2,000 to 2,500° C. In addition, the thermal treatment may be carried out for 1 to 10 hours or 1 to 5 hours.

In an embodiment, the thermal treatment may be carried out under the conditions of a temperature elevation rate of 0.5 to 5° C./min and a temperature of 500° C. or higher or 600° C. or higher. For example, it may be carried out by raising the temperature to 500 to 1000° C., maintaining the temperature for 1 to 5 hours for heating, and then lowering the temperature at a rate of 0.5 to 5° C./min.

In another embodiment, the thermal treatment may be carried out under the conditions of a temperature elevation rate of 1 to 5° C./min and a temperature of 1,500° C. or higher or 2,000° C. or higher. For example, it may be carried out by raising the temperature to 1,500 to 2,500° C. or 2,000 to 2,500° C., maintaining the temperature for 1 to 5 hours for heating, and then lowering the temperature at a rate of 1 to 5° C./min.

The thermal treatment may be carried out in an inert gas atmosphere. For example, it may be carried out in an argon gas or nitrogen gas atmosphere.

The thermal treatment may be carried out by induction heating or by resistance heating. That is, the thermal treatment may be carried out in an induction heating furnace or in a resistance heating furnace.

Specific Embodiment B

The process for preparing a seed crystal provided with a protective layer according to another specific embodiment comprises (b1) preparing a first composition and a second composition, each of which comprises a binder resin and a filler; (b2) coating the first composition on the rear side of a seed crystal of an SiC single crystal and carbonizing or graphitizing the coated first composition to form a first carbonaceous layer; and (b3) coating the second composition on the surface of the first carbonaceous layer and carbonizing or graphitizing the coated second composition to form a second carbonaceous layer, wherein the first carbonaceous layer and the second carbonaceous layer have different physical properties from each other.

According to the specific embodiment, the carbonaceous protective layer is formed in multiple layers, which have different physical properties from each layer. Thus, the layer quality, the adhesion between the seed crystal and the protective layer, and the thickness and the heat resistance of the protective layer may be improved as compared with the case where the protective layer is formed in a single layer. As a result, it is possible to more effectively suppress the stress that may be applied during the growth of a single crystal ingot, thereby preventing deterioration in quality such as cracking of the ingot.

Each step will be described in detail below.

(b1) Preparation of a Coating Composition

In the above step (b1), a first composition and a second composition, each of which comprises a binder resin and a filler, are prepared.

The binder resin is the main component of a coating composition for the preparation of a protective layer. The resins as exemplified in the above embodiment may be used as the binder resin.

The filler serves to promote carbonization during the thermal treatment after the coating of the composition and to prevent cracks from being generated due to an excessive shrinkage. The filler may be, as exemplified in the above embodiment, a carbon-based filler, a metal-based filler, or a composite filler thereof.

The first composition may comprise the filler in an amount of 20 to 300 parts by weight or 50 to 200 parts by weight per 100 parts by weight of the binder resin.

In addition, the second composition may comprise the filler in an amount of to 200 parts by weight or 30 to 150 parts by weight per 100 parts by weight of the binder resin.

Within the above preferable content ranges, it may be more advantageous in imparting excellent coatability to the composition and to prevent shrinkage or cracks, which may be generated during the thermal treatment after the coating of the composition.

As a more specific example, a phenolic resin may be used as the binder resin, graphite may be used as the filler, the first composition may comprise 100 to 180 parts by weight of the filler per 100 parts by weight of the binder resin, and the second composition may comprise 50 to 120 parts by weight of the filler per 100 parts by weight of the binder resin.

As another more specific example, a phenolic resin may be used as the binder resin, crystalline flake graphite may be used as the filler, the first composition may comprise 120 to 150 parts by weight of the filler per 100 parts by weight of the binder resin, and the second composition may comprise 80 to 100 parts by weight of the filler per 100 parts by weight of the binder resin.

The composition is preferably a liquid composition for the efficiency of coating.

Thus, the composition may comprise a solvent such as ethanol, methanol, acetone, dimethylformamide (DMF), dimethylsulfoxide (DMSO), and the like.

In such event, the solids content of the liquid composition may be 1 to 50% by weight or 5 to 30% by weight.

The first composition and the second composition may have different solids contents or viscosities from each other. Preferably, the first composition may have a solids content lower than that of the second composition. As a result, the first composition has a relatively low viscosity and may improve the attachment to a seed crystal.

In such event, the solids content of the first composition may be 1 to 30% by weight or 1 to 20% by weight. In addition, the solids content of the second composition may be 5 to 50% by weight or 5 to 30% by weight.

As a preferred example, the first composition has a solids content of 5 to 15% by weight, and the second composition has a solids content of 8 to 18% by weight, provided that the first composition may have a solids content lower than that of the second composition.

The composition may further comprise a wetting dispersant, a defoaming agent, or the like.

In addition, a third composition, a fourth composition, and the like having different compositions from those of the first composition and the second composition may be further adopted to provide various layers of the protective layer.

(b2) Formation of a First Carbonaceous Layer

In the above step (b2), the first composition is coated on the rear side of a seed crystal of an SiC single crystal, which is then carbonized or graphitized to form a first carbonaceous layer.

Specifically, as shown in FIGS. 4(a) to 4(c), the first composition is coated on the rear side (112) of a seed crystal (110) of an SiC single crystal to obtain a first coating layer (121'), which is dried and cured, and then carbonized or graphitized, by thermal treatment to form a first carbonaceous layer (121). In such event, the first coating layer may have a thickness of 1 to 40 μm, 1 to 20 μm, or 1 to 10 μm.

A seed crystal that has a crystal structure exemplified in the above embodiment may be used as the seed crystal. The seed crystal may be subjected to cleaning prior to the coating.

Thereafter, the first composition is coated on the read side of the seed crystal. A conventional coating method such as spin coating and tape casting may be used for the coating.

In addition, the coating may be carried out in a thickness range of 0.1 to 2,000 μm or in a thickness range of 20 to 1,500 μm. If the coating thickness is too smaller than the above preferable range, there is a possibility that the protective layer upon the thermal treatment may not serve as a protective layer. On the other hand, if it is too large, bubbles or cracks may be generated, or the coating layer may be peeled off, upon the thermal treatment.

Thereafter, the first composition coated on the rear side of the seed crystal is carbonized or graphitized to form a first carbonaceous layer.

For example, the first composition is dried and cured by thermal treatment at a temperature of 30 to 300° C. or at a temperature of 50 to 200° C., followed by carbonization or graphitization by thermal treatment at a temperature of 300° C. or higher, for example, 300 to 2,200° C.

The binder resin contained in the first composition is carbonized or further graphitized by the thermal treatment to form a first carbonaceous layer. In addition, the filler in the composition may prevent cracks that may be generated during the thermal treatment and promote the carbonization or graphitization.

More specific methods and conditions of the thermal treatment may employ the specific methods and conditions exemplified in the preparation of a carbonaceous protective layer in the above embodiment.

(b3) Formation of a Second Carbonaceous Layer

In the above step (b3), the second composition is coated on the surface of the first carbonaceous layer, which is then carbonized or graphitized to form a second carbonaceous layer.

Specifically, as shown in FIGS. 4(d) and 4(e), the second composition is coated on the surface of first carbonaceous layer (121) to obtain a second coating layer (122'), which is dried and cured, and then carbonized or graphitized, by thermal treatment to form a second carbonaceous layer (122). In such event, the second coating layer may have a thickness of 11 to 100 μm, 11 to 50 μm, or 11 to 30 μm.

The process conditions for forming the first carbonaceous layer exemplified in the embodiment may be adopted as the specific process conditions for forming the second carbonaceous layer.

The first carbonaceous layer and the second carbonaceous layer may have different amounts of a filler from each other. Preferably, the second carbonaceous layer may have an amount of a filler greater than that of the first carbonaceous layer. That is, the amount of a filler contained in the second carbonaceous layer may be greater than the amount of a filler contained in the first carbonaceous layer.

As the second carbonaceous layer contains a filler in a relatively large amount as described above, it is possible to secure the necessary heat resistance at the time of growth at high temperatures.

In order to increase the amount of a filler contained in the second carbonaceous layer, the filler content (%) of the second carbonaceous layer may be increased, or the thickness of the second carbonaceous layer may be increased. As a result, the second carbonaceous layer may have a greater filler content or a greater thickness than that of the first carbonaceous layer.

In addition, if desired, an additional carbonaceous layer may be further formed on the second carbonaceous layer (122). In such event, the additional carbonaceous layer may be formed from the raw material composition (i.e., the second composition) of the second carbonaceous layer or may be formed from another composition (e.g., a third composition, a fourth composition, or the like).

For example, 1 to 8 or 1 to 4 additional carbonaceous layers may be further formed on the second carbonaceous layer. In such event, the additional carbonaceous layers may be formed from the second composition.

As a result of the repetitive formation of a carbonaceous layer, a seed crystal (110) having a carbonaceous protective layer in multiple layers (120) is obtained.

Specific Embodiment C

The process for preparing a seed crystal provided with a protective layer according to still another specific embodiment comprises (c1) molding a composition that comprises a binder resin into a sheet form to prepare a protective layer; (c2) cutting the protective layer and attaching it to the rear side of a seed crystal of a silicon carbide (SiC) single crystal by pressure thereon; and (c3) curing and carbonizing the protective layer attached to the seed crystal, wherein the protective layer has a diameter larger than that of the seed crystal, whereby it covers the entire rear side of the seed crystal and has a protrusion member that protrudes outward from the periphery of the seed crystal.

According to the specific embodiment, a carbonaceous protective layer is formed on the rear side of a seed crystal. Thus, it is possible to prevent loss of the rear side of the seed crystal that may otherwise occur during the heating for the growth thereof. In particular, according to the embodiment, the protective layer in a sheet form is prepared in advance and then attached to the seed crystal, rather than it is directly formed on the surface of the seed crystal. Thus, it is possible to readily form a protective layer and to achieve a uniform thickness and layer quality.

In particular, this process can prepare a protective layer that has a diameter larger than that of a seed crystal. As a result, the protrusion member of the protective layer is used as a support for a seed crystal when it is placed in a reaction vessel. Thus, it is possible to obtain an ingot having a large diameter by preventing the diameter thereof from being reduced during the growth of an SiC single crystal ingot while producing an effect similar to the case where a seed crystal holder is used, even though the conventional method in which a seed crystal is attached to a seed crystal holder is not adopted. In addition, according to the embodiment, since the seed crystal does not need to be in direct contact with the reaction vessel, which is a heating body, the loss and contamination of the seed crystal can be suppressed.

FIG. 8 shows a method of forming a protective layer on a seed crystal according to the embodiment. FIG. 9 shows a method of attaching a protective layer to a seed crystal according to still the embodiment.

Each step will be described in detail below with reference to the drawings.

(c1) Molding of a Protective Layer in a Sheet Form

In the above step (c1), a composition that comprises a binder resin is molded into a sheet form to prepare a protective layer.

The binder resin is the main component of a coating composition for the preparation of a protective layer. The resins as exemplified in the above embodiment may be used as the binder resin.

The composition may further comprise a filler in addition to the binder resin. The filler serves to promote carbonization during the thermal treatment after the coating of the composition and to prevent cracks from being generated due to an excessive shrinkage. The filler may be, as exemplified in the above embodiment, a carbon-based filler, a metal-based filler, or a composite filler thereof.

The filler may be employed in the composition in an amount of 10 to 200 parts by weight or 30 to 150 parts by weight per 100 parts by weight of the binder resin. If the content of the filler is within the above preferable range, it may be more advantageous in preventing shrinkage and cracks, which may be generated during the thermal treatment after the formation of a coating layer, to thereby form a protective layer having an excellent surface.

As a more specific example, a phenolic resin may be used as the binder resin, graphite may be used as the filler, and the composition may comprise 50 to 120 parts by weight of the filler per 100 parts by weight of the binder resin.

The composition may further comprise a solvent for controlling the viscosity thereof when it is molded.

For example, the composition may comprise a solvent such as ethanol, methanol, acetone, dimethylformamide (DMF), dimethylsulfoxide (DMSO), and the like. In such event, the solids content of the composition may be 10 to 9% by weight or 20 to 50% by weight.

The composition may further comprise a wetting dispersant, a defoaming agent, or the like.

The composition thus prepared is molded into a sheet form to prepare a protective layer. The molding may be carried out using such a process as roll coating, comma coating, dip coating, and the like.

The molding into a sheet form may be carried out in a thickness range of 10 to 3,000 μm or in a thickness range of 100 to 1,000 μm. If the molding thickness is too smaller than the above preferable range, there is a possibility that the tensile strength of the protective layer may be low and that the protective layer upon the thermal treatment may not serve as a protective layer. On the other hand, if it is too large, bubbles or cracks may be generated, or the coating layer may be peeled off, upon the thermal treatment.

In addition, it is preferable to carry out a step of laminating a release film on both sides of the protective layer molded from the composition into a sheet form.

The release film serves to prevent the problem that the surface of the protective layer is contaminated during the molding process or that the composition, which is not dried yet, comes into contact with the equipment thereby impairing the processability.

As a preferred example, the preparation of the protective layer is carried out using roll coating. In such event, a release film is laminated on both sides of the protective layer, which release film may be removed before a subsequent curing or carbonization step.

The release film may be a conventional release film. For example, it may be a PET film coated with silicone, a paper film coated with silicon, or the like. The release film may have a thickness of 25 to 100 μm. In addition, the release film may have a peel strength of 3 to 30 gf/inch.

The molding of the protective layer may be carried out as a single layer or a multilayer.

In the case of single-layer molding, the above composition only may be molded into a sheet form to prepare a protective layer.

In the case of multi-layer molding, the composition may be coated on a core layer (i.e., a separate substrate), which is then molded into a sheet form to prepare a protective layer.

According to a preferred example, the composition may be coated on both sides of a core layer composed of a fibrous material, which is then molded into a sheet form to prepare a protective layer.

As a core layer of a fibrous material is used as described above, it is possible to readily form a thick protective layer, and it is more advantages in achieving a uniform thickness and layer quality. In addition, as a core layer of a fibrous material is used, the strength of the protective layer is increased to prevent the seed crystal from vanishing or peeling off when a single crystal ingot is grown, and it may be more effective to prevent deformation of the seed crystal by suppressing shrinkage of the protective layer.

In such event, the core layer of a fibrous material may, more specifically, comprise cellulose, rayon, carbon fiber, or the like.

More preferably, the core layer may be composed of a cellulose fiber.

The core layer may increase the tensile strength of the protective layer, thereby improving the supporting force thereof when a seed crystal is placed in a reaction vessel for the growth of an SiC ingot.

According to a specific example, referring to FIG. 8(a), the preparation of a protective layer is carried out using roll coating. In such event, the composition (123) is coated on both sides of a core layer (130) composed of a fibrous material, which is then molded into a sheet form to prepare a protective layer (120). In addition, a first release film (141) and a second release film (142) are laminated on both sides of the protective layer (120). The first release film (141) and the second release film (142) may be removed before a subsequent curing or carbonization step.

(c2) Attachment of a Seed Crystal to a Protective Layer

In the above step (c2), the protective layer is cut and attached to the rear side of a seed crystal of an SiC single crystal by pressure thereon.

Since the protective layer prepared above is in a sheet form without a particular shape, it needs to be cut to be attached to the rear side of a seed crystal.

Specifically, since the shape of the rear side of a seed crystal is generally circular, the protective layer may be cut into a circular shape.

According to the embodiment, the protective layer is cut such that it covers the entire rear side of a seed crystal and has a protrusion member that protrudes outward from the periphery of the seed crystal.

For example, the protective layer may be cut into a circular shape having a diameter larger than the diameter of the rear side of a seed crystal by 0.1 to 4 inches or 0.3 to 1 inch.

Thereafter, the protective layer thus cut is attached to the rear side of a seed crystal of an SiC single crystal.

A seed crystal that has a crystal structure exemplified in the above embodiment may be used as the seed crystal. The seed crystal may be subjected to cleaning prior to the coating.

In addition, in order for the protective layer to be in direct contact with the rear side of the seed crystal, the release film in the region to which the seed crystal is to be attached may be removed in advance, and the protective layer is attached thereto by pressure thereon.

Specifically, the protective layer cut into a sheet form has a structure in which a first release film is laminated on one side and a second release film is laminated on the other side. As shown in FIG. 8(b), the protective layer in a laminated structure as described above may be first cut into a circular shape (c2) having a diameter larger than that of the rear side of the seed crystal. Then, only the second release film (142) in the region (c1) to which the rear side of the seed crystal is to be attached may be secondarily cut out.

As a result, as shown in FIG. 8(c), the protective layer (120) may have a structure in which the first release film (141) is laminated on one side and the second release film (142) is laminated on the other side, and the second release film (142) in the region of to the protective layer (120) to which the seed crystal is to be attached is removed so that the protective layer (120) is exposed to the outside. In addition, the protective layer (120) may comprise a core layer (130) of a fibrous material to have an enhanced tensile strength.

Thereafter, as shown in FIGS. 9(a) and 9(b), the rear side (112) of the seed crystal (110) of an SiC single crystal is brought into contact with the protective layer (120) thus cut, and the seed crystal is attached to the protective layer by pressure thereon (600). Preferably, since the protective layer (120) comprises an uncured binder resin, the protective layer and the seed crystal can be readily attached by pressure thereon (600).

(c3) Curing and Carbonization of a Protective Layer

In the above step (c3), the protective layer attached to the seed crystal is cured and carbonized.

For example, the protective layer may be dried and cured by thermal treatment at a temperature of 30 to 300° C. or at a temperature of 50 to 200° C.

Thereafter, the protective layer thus cured may be carbonized or graphitized by thermal treatment at a temperature of 300° C. or higher, for example, 300 to 2,200° C.

The binder resin contained in the protective layer is carbonized or further graphitized by the thermal treatment to form a carbonaceous protective layer. In addition, the filler in the protective layer may prevent cracks that may be generated during the thermal treatment and promote the carbonization or graphitization.

More specific methods and conditions of the thermal treatment may employ the specific methods and conditions exemplified in the preparation of a carbonaceous protective layer in the above embodiment.

The carbonization is preferably carried out once all of the release films attached to the protective layer have been removed.

As a specific example, as shown in FIG. 9(c), it is preferable to remove the first release film (141) provided on the side of the protective layer (120) to which the seed crystal (110) is not attached and then carry out the curing step since the solvent is readily volatilized. In such event, it is advantageous in preventing deformation of the protective layer and suppressing fusion to leave the second release film (142) provided on the side of the protective layer (120) to which the seed crystal (110) has been attached. After the curing, as shown in FIG. 9(d), the second release film (142) is removed from the protective layer (120), and the carbonization may then be carried out.

A seed crystal having a carbonized protective layer is obtained through the above steps. The total thickness of the carbonized protective layer may be 5 to 1,500 μm, 10 to 1,000 μm, 50 to 500 μm, or 50 to 2,000 μm.

According to the above process, a protective layer in a sheet form is prepared in advance and then attached to a seed crystal, rather than it is directly formed on the surface of the seed crystal. Thus, it is possible to readily form a protective layer and to achieve a uniform thickness and layer quality. In particular, according to the process, it is possible to prepare a protective layer having a diameter larger than that of a seed crystal (which is difficult to achieve in the case where a protective layer is directly formed on the surface of a seed crystal). As a result, the protrusion member of the protective layer is used as a support for a seed crystal when it is placed in a reaction vessel. Thus, it is possible to obtain an ingot having a large diameter by preventing the diameter thereof from being reduced during the growth of an SiC single crystal ingot while producing an effect similar to the case where a seed crystal holder is used, even though the conventional method in which a seed crystal is attached to a seed crystal holder is not adopted. In addition, according to the embodiment, since the seed crystal is not in direct contact with the reaction vessel, which is a heating body, the loss and contamination of the seed crystal can be suppressed.

<Seed Crystal Provided with a Protective Layer>

In addition, the seed crystal of an SiC single crystal provided with a protective layer according to an embodiment comprises a seed crystal of an SiC single crystal and a carbonaceous protective layer formed on the rear side of the seed crystal.

Specific Embodiment A

The seed crystal provided with a protective layer according to a specific embodiment comprises a seed crystal of an SiC single crystal and a carbonaceous protective layer formed on the rear side of the seed crystal, wherein the carbonaceous protective layer has a thickness of 5 to 1,000 µm and comprises a filler selected from a group consisting of a carbon-based filler, a metal-based filler, and a composite filler thereof.

As the protective layer formed by thermal treatment comprises a filler as described above, it is possible to improve the strength of the protective layer and to prevent cracks and detachment of the seed crystal.

The filler may be, as exemplified above, a carbon-based filler, a metal-based filler, or a composite filler thereof. In addition, the filler may be employed in an amount of 5 to 95% by weight, 50 to 95% by weight, or 70 to 90% by weight, based on the weight of the carbonaceous protective layer. If the content of the filler in the carbonaceous protective layer is within the above preferable range, it may be more advantageous in improving the strength of the protective layer and in preventing cracks and detachment of the seed crystal.

In addition, the carbonaceous protective layer comprises a carbonized binder resin. In such event, the kind of the binder resin is as exemplified above.

The carbonaceous protective layer may comprise uncrystallized carbon or crystallized carbon. For example, the carbonaceous protective layer may comprise a carbide or a graphitized substance. For example, the carbonaceous protective layer may comprise a carbide or a graphitized substance of a resin selected from a group consisting of a phenolic resin, a polyacrylonitrile resin, a pitch-based resin, a polyvinyl chloride resin, a polyacrylic acid resin, a furan-based resin, an epoxy-based resin, and a mixed resin thereof.

The thickness of the carbonaceous protective layer may be, for example, 1 to 1,500 µm, 5 to 1,000 µm, or 20 to 500 µm.

Specific Embodiment B

The seed crystal provided with a protective layer according to another specific embodiment comprises a seed crystal of a silicon carbide (SiC) single crystal and a carbonaceous protective layer formed on the rear side of the seed crystal, wherein the protective layer comprises a first carbonaceous layer abutting on the rear side of the seed crystal and a second carbonaceous layer formed on the first carbonaceous layer, and the first carbonaceous layer and the second carbonaceous layer have different physical properties from each other.

The first carbonaceous layer and the second carbonaceous layer are different from each other in such physical properties as thickness, adhesiveness, heat resistance, and the like.

The first carbonaceous layer is excellent in adhesiveness to a seed crystal. Thus, it is possible to prevent peeling-off during the thermal treatment after the coating and the growth of an ingot. Specifically, the first carbonaceous layer may have a relatively higher adhesiveness than that of the second carbonaceous layer.

In addition, the second carbonaceous layer is excellent in heat resistance at high temperatures. Thus, it is possible to prevent cracks in the protective layer or vanishment thereof during the thermal treatment after the coating and the growth of an ingot. Specifically, the second carbonaceous layer may have a relatively higher heat resistance than that of the first carbonaceous layer.

In addition, the first carbonaceous layer and the second carbonaceous layer may have different thicknesses from each other. Preferably, the second carbonaceous layer may have a greater thickness than that of the first carbonaceous layer.

In such event, the thickness of the first carbonaceous layer may be 0.1 to 20 µm, 0.2 to 15 µm, or 0.3 to 10 µm. In addition, the thickness of the second carbonaceous layer may be 1 to 50 µm, 2 to 30 µm, or 3 to 20 µm.

As a specific example, the first carbonaceous layer may have a thickness of 0.5 to 5 µm, and the second carbonaceous layer may have a thickness of 6 to 15 µm.

The protective layer may be formed by carbonization or graphitization of a composition that comprises a binder resin and a filler. That is, the first carbonaceous layer and the second carbonaceous layer may be formed by carbonization or graphitization of a composition that comprises a binder resin and a filler.

Thus, the carbonaceous protective layer may comprise uncrystallized carbon or crystallized carbon. For example, the carbonaceous protective layer may comprise a carbide or a graphitized substance of the binder resin.

In such event, the binder resin may be a phenolic resin, a polyacrylonitrile resin, a pitch-based resin, a polyvinyl chloride resin, a polyacrylic acid resin, a furan-based resin, an epoxy-based resin, or a mixed resin thereof. In addition, the filler may be a carbon-based filler, a metal-based filler, or a composite filler thereof.

In addition, the first carbonaceous layer and the second carbonaceous layer may have different amounts of a filler from each other. Preferably, the second carbonaceous layer may have an amount of a filler greater than that of the first carbonaceous layer.

As a specific example, the first carbonaceous layer and the second carbonaceous layer may be formed by carbonization or graphitization of a composition that comprises a binder resin and a filler. In such event, the second carbonaceous layer may have a thickness and an amount of a filler greater than those of the first carbonaceous layer, and the filler may be a carbon-based filler, a metal-based filler, or a composite filler thereof.

In addition, the first carbonaceous layer and the second carbonaceous layer may be formed by carbonization or graphitization of a first composition and a second composition, respectively. In such event, the first composition may have a solids content lower than that of the second composition.

The protective layer may further comprise 1 to 8 additional carbonaceous layers in addition to the first carbonaceous layer and the second carbonaceous layer. That is, the protective layer may further comprise additional carbonaceous layers such as a third carbonaceous layer, a fourth carbonaceous layer, and the like on the second carbonaceous layer.

In such event, the additional carbonaceous layers may have physical properties the same as, or different from, those of the first carbonaceous layer or those of the second carbonaceous layer. For example, the additional carbonaceous layers may have the same physical properties as those of the second carbonaceous layer.

The total thickness of the carbonized protective layer in a multilayer may be, for example, 10 to 1,500 µm, 15 to 1,000 µm, or 20 to 500 µm.

As a preferred example, the protective layer may further comprise 1 to 8 additional carbonaceous layers, and the protective layer may have a total thickness of 20 to 1,500 µm.

As described above, the carbonaceous protective layer is formed in multiple layers, which have different physical properties from each layer, whereby the layer quality, the adhesion between the seed crystal and the protective layer, and the thickness and the heat resistance of the protective layer may be improved as compared with the case where the protective layer is formed in a single layer.

Specific Embodiment C

The seed crystal provided with a protective layer according to still another specific embodiment comprises a seed crystal of a silicon carbide (SiC) single crystal and a protective layer formed on the rear side of the seed crystal, wherein the protective layer has a diameter larger than that of the seed crystal, whereby it covers the entire rear side of the seed crystal and has a protrusion member that protrudes outward from the periphery of the seed crystal.

As described above with respect to the process, the protective layer may be formed by carbonization or graphitization of a composition that comprises a binder resin and a filler.

Thus, the protective layer may comprise uncrystallized carbon or crystallized carbon. For example, the protective layer may comprise a carbide or a graphitized substance of the binder resin.

In such event, the binder resin may be a phenolic resin, a polyacrylonitrile resin, a pitch-based resin, a polyvinyl chloride resin, a polyacrylic acid resin, a furan-based resin, an epoxy-based resin, or a mixed resin thereof. In addition, the filler may be a carbon-based filler, a metal-based filler, or a composite filler thereof.

Preferably, the protective layer may be formed by carbonization or graphitization of a composition that comprises a binder resin and a filler.

Specifically, the protective layer may be formed by carbonization or graphitization of a composition that comprises a filler in an amount of 50 to 120 parts by weight per 100 parts by weight of the binder resin. If the content of the filler in the protective layer is within the above preferable range, it may be more advantageous in preventing cracks and detachment of the seed crystal during the growth of an ingot at high temperatures.

FIGS. 7A and 7B show a cross-section of a seed crystal provided with a protective layer according to the embodiment.

Referring to FIG. 7A, the seed crystal (10) provided with a protective layer comprises a seed crystal (110) of an SiC single crystal and a protective layer (120) formed on the rear side (111) of the seed crystal (110).

Alternatively, referring to FIG. 7B, the seed crystal (10') provided with a protective layer according to another embodiment comprises a seed crystal (110) of an SiC single crystal and a protective layer (120) formed on the rear side (111) of the seed crystal (110), wherein the protective layer (120) comprises a core layer (130), which core layer (120) may be formed by carbonization of a fibrous material.

In particular, the protective layer (120) has a diameter larger than that of the seed crystal (110), whereby it covers the entire rear side (112) of the seed crystal and has a protrusion member (125) that protrudes outward from the periphery of the seed crystal.

The protrusion member (125) may be used as a support for a seed crystal when it is placed in a reaction vessel for the growth of an SiC ingot.

Preferably, it is advantageous for the purpose of preventing thermal shock and thermal etching of the surface of the seed crystal that the protrusion member (125) has a length in the range of 0.1 to 4 inches or in the range of 0.3 to 1 inch when viewed from a cross-section of the protective film (120).

As a preferred example, the protective layer may have a total thickness of 50 to 2,000 µm, and the protrusion member may have a length in the range of 0.3 to 1 inch when viewed from a cross-section of the protective film. In addition, in such event, the protective layer may comprise a core layer formed by carbonization of a fibrous material.

<Process for Growing an SiC Single Crystal Ingot>

The process for growing a silicon carbide (SiC) single crystal ingot according to an embodiment comprises (1) forming a protective layer on the rear side of a seed crystal of a silicon carbide single crystal; (2) charging an SiC raw material to a lower region of a reaction vessel and placing the seed crystal on an upper region of the reaction vessel without adhesion thereto; and (3) growing an SiC single crystal ingot on the front side of the seed crystal from the SiC raw material.

Each step will be described in detail below.

(1) Preparation of a Seed Crystal Provided with a Protective Layer

In the above step (1), a protective layer is formed on the rear side of a seed crystal of an SiC single crystal.

According to a specific embodiment, the above step (1) may comprise preparing a composition that comprises a binder resin and a filler; and coating the composition on the rear side of an SiC seed crystal and thermally treating the coated composition to form a carbonaceous protective layer. In addition, in such event, the protective layer may have a thickness of 5 to 1,000 µm and comprises a carbon-based filler, a metal-based filler, or a composite filler thereof in an amount of 50 to 95% by weight based on the weight of the carbonaceous protective layer. In addition, the protective layer may be formed in the same shape and area as those of the rear side of the seed crystal.

According to another specific embodiment, the above step (1) may comprise preparing a first composition and a second composition, each of which comprises a binder resin and a filler; coating the first composition on the rear side of a seed crystal of an SiC single crystal and carbonizing or graphitizing the coated first composition to form a first carbonaceous layer; and coating the second composition on the surface of the first carbonaceous layer and carbonizing or graphitizing the coated second composition to form a second carbonaceous layer. In such event, the first composition may have a solids content lower than that of the second composition, and the second carbonaceous layer may have an amount of a filler greater than that of the first carbonaceous layer. In addition, the protective layer may be formed in the same shape and area as those of the rear side of the seed crystal.

According to still another specific embodiment, the above step (1) may comprise molding a composition that comprises a binder resin into a sheet form to prepare a protective layer; cutting the protective layer and attaching it to the rear side of a seed crystal of an SiC single crystal by pressure thereon; and curing and carbonizing the protective layer attached to the seed crystal. In the above step (1), the composition may be coated on both sides of a core layer composed of a fibrous material to a sheet form. In such event, the protective layer may have a diameter larger than that of the seed crystal, whereby it covers the entire rear side of the seed crystal and has a protrusion member that protrudes outward from the periphery of the seed crystal. In addition, the carbonized protective layer may have a total thickness of 50 to 2,000 μm.

Other detailed process conditions are as described above.

In addition, the details of the seed crystal provided with a protective layer thus prepared are as described above.

(2) Charge of a SiC Raw Material and Placement of a Seed Crystal

In the above step (2), an SiC raw material is charged to a lower region of a reaction vessel, and the seed crystal is placed on an upper region of the reaction vessel without adhesion thereto.

In the process according to the embodiment, the seed crystal is not adhered to a holder as described above. Preferably, the reaction vessel is not provided with a holder for the adhesion of a seed crystal.

As an example, referring to FIGS. 1A and 3A, the reaction vessel (200) is provided with a flat rack (250) in an upper region without a seed crystal holder, and the seed crystal (110) may be placed on the rack (250) without adhesion thereto. In such event, the seed crystal (110) may be placed such that the front side of the seed crystal faces the SiC raw material. That is, the seed crystal may be placed such that the front side (i.e., the growing side) of the seed crystal (110) faces the bottom of the reaction vessel (200) and that the rear side (i.e., the side provided with a protective layer) faces the top of the reaction vessel (200). The shape of the rack (250) is not particularly limited as long as it has a flat top end. In addition, the rack (250) may be formed in such a manner that a part of the upper inner wall of the reaction vessel (200) protrudes.

As another example, referring to FIGS. 1B and 3B, the reaction vessel (200) is provided with a rack (250) in an upper region without a seed crystal holder. Here, the rack has a groove, and the seed crystal may be fit in the groove of the rack without adhesion thereto. In such event, the seed crystal (110) may be placed such that the front side of the seed crystal faces the SiC raw material. That is, the seed crystal may be placed such that the front side (i.e., the growing side) of the seed crystal (110) faces the bottom of the reaction vessel (200) and that the rear side (i.e., the side provided with a protective layer) faces the top of the reaction vessel (200). The shape of the rack (250) is not particularly limited as long as it has a groove in which a seed crystal may be fit. For example, it may have a shape in which the groove is cut from the cross-section to a "[" shape. In addition, the rack (250) may be coupled to a lid (220) of the reaction vessel (200).

As still another example, the reaction vessel (200) is provided with a rack (250) in an upper region without a seed crystal holder, and the protective layer has a diameter larger than that of the seed crystal, whereby it covers the entire rear side of the seed crystal and has a protrusion member that protrudes outward from the periphery of the seed crystal. The protrusion member of the protective layer may be placed in an upper region of the reaction vessel for placing the seed crystal. Specifically, referring to FIG. 5A, the reaction vessel (200) is provided with a rack (250) on the upper inner wall without a seed crystal holder. The protrusion member of the protective layer (120) may be placed on the rack (250) for placing the seed crystal (110). In such event, the seed crystal (110) may be placed such that the front side of the seed crystal faces the SiC raw material (300). That is, the seed crystal may be placed such that the front side (i.e., the growing side) of the seed crystal (110) faces the bottom of the reaction vessel (200) and that the rear side (i.e., the side provided with a protective layer) faces the top of the reaction vessel. In such event, the shape of the rack (250) is not particularly limited as long as it has a structure on which the protrusion member of the protective layer may be placed. For example, the rack (250) may have a shape in which the groove is cut from the cross-section to a "[" shape, and the protrusion member of the protective layer (120) may be fit in the groove. Alternatively, the rack (250) may have a shape of a flat top end, and the protrusion member of the protective layer may be placed on the rack.

Once the seed crystal has been placed, the upper region of the reaction vessel may be closed by a lid.

Alternatively, the reaction vessel may have a structure in which its upper region is open, and the reaction vessel may be closed by a seed crystal placed in an upper region of the reaction vessel. For example, as shown in FIGS. 6A and 6B, the reaction vessel (200) is provided with no lid or an open-type lid (220) in an upper region. The reaction vessel may be closed by a seed crystal (provided with a protective layer) to be fit in the groove of the rack (250).

The reaction vessel (200) may be a crucible and is made of a material having a melting point higher than the sublimation temperature of SiC. For example, the reaction vessel may be composed of a carbonaceous component, specifically a graphite component. In addition, the rack may be composed of a carbonaceous component, which is the same as, or different from, that of the reaction vessel.

In addition, the SiC raw material may be, for example, an SiC powder.

Thereafter, the reaction vessel may be wrapped with a heat insulation material and placed in a reaction chamber (e.g., a quartz tube or the like) having a heating means. In such event, the heating means may be, for example, an induction heating coil or resistance heating means.

(3) Growth of an SiC Single Crystal Ingot

In the above step (3), an SiC single crystal ingot is grown on the front side of the seed crystal from the SiC raw material.

Referring to FIG. 5B, the growth of an ingot may be carried out by the growth of an SiC single crystal ingot (400) on the seed crystal (110) by sublimating the SiC raw material (300).

As to the temperature and pressure conditions for growing an SiC single crystal ingot, for example, the step of growing an SiC single crystal ingot may be carried out by heating under the conditions of 2,000 to 2,500° C. and 1 to 200 torr, under the conditions of 2,200 to 2,400° C. and 1 to 150 torr, under the conditions of 2,200 to 2,300° C. and 1 to 100 torr, or under the conditions of 2,250 to 2,300° C. and 1 to 50 torr.

However, since the growth of an SiC single crystal ingot is based on the principle that an SiC raw material is sublimated into SiC gas at a high temperature, and the SiC gas then grows into a single crystal ingot under a reduced pressure condition, the temperature and pressure conditions for the growth of an SiC single crystal ingot may be employed without any particular limitation, provided that the growth is carried out under a reduced pressure condition as compared with the temperature and pressure conditions under which the SiC raw material is sublimated.

That is, the temperature and pressure conditions exemplified in the above as specific numerical ranges may be adjusted to an appropriately higher pressure condition if the growth is carried out under a higher temperature condition, thereby producing the same effect.

Upon the heating for the growth as described above, the seed crystal is also heated. In such event, if a protective layer is not provided, a part of the seed crystal may be vanished by sublimation. That is, although the front side (i.e., the growing side) of the seed crystal would not be affected by the heating since SiC gas sublimated from the raw material is continuously supplied thereto, the rear side of the seed crystal may be affected. According to the embodiment, however, a protective layer is formed on the rear side of the seed crystal. Thus, it is possible to prevent loss of the rear side of the seed crystal that may otherwise occur during the heating.

In addition, according to a specific embodiment, a filler is contained in the carbonaceous protective layer to prevent cracks or the like that may be generated in the protective layer during the thermal treatment.

In addition, according to another specific embodiment, the carbonaceous protective layer is formed in multiple layers, which have different physical properties from each layer, whereby the layer quality, the adhesion between the seed crystal and the protective layer, and the thickness of the protective layer may be improved as compared with the case where the protective layer is formed in a single layer. As a result, it is possible to more effectively suppress the stress that may be applied during the growth of a single crystal ingot, thereby preventing deterioration in quality such as cracking of the ingot.

In addition, according to still another specific embodiment, the protective layer has a diameter larger than that of the seed crystal, whereby it has a protrusion member that protrudes outward. Since the protrusion member is used as a support (since the seed crystal has no rack), it is possible to obtain an ingot having a large diameter by preventing the diameter thereof from being reduced during the growth of an SiC single crystal ingot while producing an effect similar to the case where a seed crystal holder is used, even though the conventional method in which a seed crystal is attached to a seed crystal holder is not adopted. In addition, according to the embodiment, since the seed crystal is not in direct contact with the reaction vessel, which is a heating body, the loss and contamination of the seed crystal can be suppressed.

In particular, according to the embodiment, since the seed crystal is not attached to a holder, an SiC single crystal ingot can be prepared with a large diameter. For example, an SiC single crystal ingot upon the growth step according to the embodiment may have a diameter of 2 inches or more, 3 inches or more, 4 inches or more, 5 inches or more, or even 6 inches or more. As an example, an SiC single crystal ingot prepared according to the embodiment may have a diameter ranging from 2 to 10 inches, from 2 to 8 inches, from 4 to 8 inches, or from 4 to 6 inches.

In addition, according to the process of the embodiment, since an adhesive is not applied to a seed crystal, an SiC single crystal ingot can be grown with high quality. For example, an SiC single crystal ingot prepared according to the embodiment may have a purity of 99% or more, 99.5% or more, or even 99.9% or more.

EXAMPLE

Hereinafter, more specific examples will be described for illustrative purposes.

<Example A> Preparation and Use of a Seed Crystal Provided with a Single-Layered Protective Layer The materials used in Example A below are as follows:
Liquid phenolic resin: phenolic resin/methyl alcohol/water=58 to 62:36 to 41:0 to 4 (weight ratio), Neolite KC-4703, Kangnam Chemical Co., Ltd.
Crystalline flake graphite: average particle size ($D_{50}$) of 2.5 μm
Silicon carbide seed crystal: single crystal substrate of 4 to 6 inches in diameter, 500 to 1,200 μm in thickness, and a crystal structure of 3C, 4H, 6H, 15R.

Example A1-1: Preparation of a Seed Crystal Provided with a Protective Layer

The liquid phenolic resin was mixed with crystalline flake graphite as a filler in a weight ratio of 7:3. The mixture was further mixed with additives such as a wetting dispersant and a defoaming agent in an amount of 3 parts by weight or less per 100 parts by weight of the mixture, which was dispersed to obtain a composition. The composition was spin-coated on one side of the silicon carbide seed crystal to obtain a coating layer having a thickness of 0.5 mm. The seed crystal thus coated was placed in a heater, heated at a rate of 1° C./min to reach 600° C., and then thermally treated for 2 hours to carbonize the coating layer. Thereafter, it was cooled at a rate of 1° C./min to obtain a seed crystal provided with a carbonaceous protective layer on one side.

Example A1-2: Preparation of a Seed Crystal Provided with a Protective Layer

The liquid phenolic resin was mixed with crystalline flake graphite as a filler in a weight ratio of 95:5. The mixture was further mixed with additives such as a wetting dispersant and a defoaming agent in an amount of 3 parts by weight or less per 100 parts by weight of the mixture, which was dispersed to obtain a composition. The composition was spin-coated on one side of the silicon carbide seed crystal to obtain a coating layer having a thickness of 0.5 mm. The seed crystal thus coated was placed in a heater, heated at a rate of 1° C./min to reach 600° C., and then thermally treated for 2 hours to carbonize the coating layer. Thereafter, it was cooled at a rate of 1° C./min to obtain a seed crystal provided with a carbonaceous protective layer on one side.

Example A1-3: Preparation of a Seed Crystal Provided with a Protective Layer

The liquid phenolic resin was mixed with crystalline flake graphite as a filler in a weight ratio of 5:95. The mixture was further mixed with additives such as a wetting dispersant and a defoaming agent in an amount of 3 parts by weight or less per 100 parts by weight of the mixture, which was dispersed to obtain a composition. The composition was spin-coated on one side of the silicon carbide seed crystal to obtain a coating layer having a thickness of 0.5 mm. The seed crystal thus coated was placed in a heater, heated at a rate of 1° C./min to reach 600° C., and then thermally treated for 2 hours to carbonize the coating layer. Thereafter, it was cooled at a rate of 1° C./min to obtain a seed crystal provided with a carbonaceous protective layer on one side.

Example A1-4: Preparation of a Seed Crystal Provided with a Protective Layer

A polyacrylonitrile (PAN) resin, DMSO as a solvent, and crystalline flake graphite as a filler were mixed at a weight ratio of 3:5:2 and dispersed to obtain a composition. The composition was spin-coated on one side of the silicon carbide seed crystal to obtain a coating layer having a thickness of 0.5 mm. The seed crystal thus coated was placed in a heater, heated at a rate of 0.5° C./min to reach 600° C., and then thermally treated for 2 hours to carbonize the coating layer. Thereafter, it was cooled at a rate of 1° C./min to obtain a seed crystal provided with a carbonaceous protective layer on one side.

Example A1-5: Preparation of a Seed Crystal Provided with a Protective Layer

A polyacrylonitrile (PAN) resin, DMSO as a solvent, and crystalline flake graphite as a filler were mixed at a weight ratio of 3:5:2 and dispersed to obtain a composition. The composition was spin-coated on one side of the silicon carbide seed crystal to obtain a coating layer having a thickness of 0.5 mm. The seed crystal thus coated was placed in a heater, heated at a rate of 1° C./min to reach 2,200° C., and then thermally treated for 2 hours to graphitize the coating layer. Thereafter, it was cooled at a rate of 1° C./min to obtain a seed crystal provided with a graphitized carbonaceous protective layer on one side.

Comparative Example A1: Preparation of a Seed Crystal Provided with a Protective Layer (without a Filler)

The liquid phenolic resin, without being mixed with the filler, was spin-coated on one side of the silicon carbide seed crystal to obtain a coating layer having a thickness of 0.4 mm. The seed crystal thus coated was placed in a heater, heated at a rate of 1° C./min to reach 600° C., and then thermally treated for 2 hours to carbonize the coating layer. Thereafter, it was cooled at a rate of 1° C./min, and the coating layer was observed. As a result, it was confirmed that the coating layer was cracked due to shrinkage thereof and that the coating was peeled off.

Example A2: Growth of a Silicon Carbide Single Crystal Ingot

A graphite crucible provided with a rack on the upper inner wall was prepared. An SiC powder (purity: about 98%) was charged as a raw material to the lower region of the crucible. In addition, the seed crystal provided with a protective layer on one side as prepared in the above Example A1-1 was placed on the rack in the crucible (see FIG. 1A). In such event, the seed crystal was merely placed on the rack without adhesion thereto. In addition, the protective layer faced the top of the crucible, and the side without the protective layer faced the bottom of the crucible.

The crucible was wrapped with a heat insulation material and placed in a reaction chamber provided with a heating coil. After the inside of the crucible was made to be a vacuum, argon gas was gradually injected to reach the atmospheric pressure, and the pressure was then gradually reduced. In addition, the temperature in the crucible was increased to 2,300° C. Thereafter, an SiC single crystal ingot was grown on the side of the seed crystal without the protective layer for 100 hours at 2,300° C. and 20 torr. As a result, an SiC single crystal ingot having a diameter of 4 inches was obtained.

Test Example A1: Evaluation of the Surface of a Protective Layer

For each of the seed crystals provided with a protective layer as prepared in the above Examples and Comparative Examples, the surface of the protective layer was observed with the naked eyes or an optical microscope. As a result, the surface of the protective layer prepared in the Examples was overall excellent. In particular, among Examples A1-1 to A1-3 prepared in various contents of the filler, the coating of the protective layer in Example A1-1 was the most excellent without shrinkage or peeling-off. In contrast, in Comparative Example A1, the coating layer was cracked due to shrinkage thereof, and the coating was peeled off.

Test Example A2: Evaluation of Cracks on the Surface of a Single Crystal Ingot

For the SiC single crystal ingot obtained in Example A2, the surface of the ingot was observed with the naked eyes or an optical microscope. As a result, no cracks were found on the surface of the ingot.

<Example B> Preparation and Use of a Seed Crystal Provided with a Multilayered Protective Layer The materials used in Example B below are as follows:
Binder resin: phenolic resin, KC-5536, Kangnam Chemical Co., Ltd.
Filler: crystalline flake graphite, purity of 80 to 99%, $D_{50}$ of 2.5 µm
Solvent: ethanol, OCI Co., Ltd.
Seed crystal of an SiC single crystal: 100 to 150 mm in diameter, a crystal structure of 4H—SiC, 350 to 1,000 µm in thickness
Powder of an SiC raw material: purity of 99.99% or more, $D_{50}$ of 100 µm Example B1: Preparation of a Seed Crystal Provided with a Protective Layer (Multilayered and a Filler Contained)

Step (1): Preparation of a Coating Composition
First, the binder resin was mixed with the solvent to prepare a solution having a solids content of about 10% by weight, to which about 135 parts by weight of the filler was added per 100 parts by weight of the binder resin. The mixture was further mixed with additives such as a wetting dispersant and a defoaming agent in an amount of 5 parts by weight or less, which was dispersed to obtain a first composition.

In addition, the binder resin was mixed with the solvent to prepare a solution having a solids content of about 13% by weight, to which about 90 parts by weight of the filler was added per 100 parts by weight of the binder resin. The mixture was further mixed with additives such as a wetting dispersant and a defoaming agent in an amount of 5 parts by weight or less, which was dispersed to obtain a second composition.

Step (2): Formation of a First Carbonaceous Layer

The first composition was spin-coated on the rear side (i.e., the opposite side to the growing side) of the silicon carbide seed crystal to obtain a first coating layer having a thickness of 5 μm. The seed crystal thus coated was placed in an oven, heated at a rate of 1° C./min to reach 600° C., and then thermally treated for 2 hours to carbonize the first coating layer. Thereafter, it was cooled at a rate of 1° C./min to obtain a seed crystal provided with a first carbonaceous layer formed on the rear side.

Step (3): Formation of a Second Carbonaceous Layer

The second composition was spin-coated on the surface of the first carbonaceous layer to obtain a second coating layer having a thickness of 20 μm. The seed crystal thus coated was placed in an oven, heated at a rate of 1° C./min to reach 600° C., and then thermally treated for 2 hours to carbonize the second coating layer. Thereafter, it was cooled at a rate of 1° C./min to obtain a seed crystal provided with a first carbonaceous layer and a second a first carbonaceous layer sequentially formed on the rear side.

Step (4): Formation of an Additional Carbonaceous Layer

In the same manner as in the above step (3), the second composition was spin-coated on the surface of the second carbonaceous layer and then thermally treated to form an additional carbonaceous layer.

Comparative Example A1: Preparation of a Seed Crystal Provided with a Protective Layer (Single-Layered and a Filler not Contained)

The liquid phenolic resin, without being mixed with the filler, was spin-coated on one side of the silicon carbide seed crystal to obtain a coating layer having a thickness of 400 μm. The seed crystal thus coated was placed in a heater, heated at a rate of 1° C./min to reach 600° C., and then thermally treated for 2 hours to carbonize the coating layer. Thereafter, it was cooled at a rate of 1° C./min to obtain a seed crystal provided with a single-layered carbonaceous protective layer formed on the rear side.

Example B2: Growth of a Silicon Carbide Single Crystal Ingot

A graphite crucible provided with a rack on the upper inner wall was prepared. The SiC powder was charged as a raw material to the lower region of the crucible. In addition, the seed crystal provided with a protective layer as prepared in the above Example B1 was placed on the rack in the crucible (see FIG. 3A). In such event, the seed crystal was merely placed on the rack without adhesion thereto. In addition, the rear side (i.e., the side provided with a protective layer) faced the top of the reaction vessel, and the front side (i.e., the side without a protective layer) of the seed crystal faced the bottom of the reaction vessel.

The crucible was closed with a lid, wrapped with a heat insulation material, and placed in a reaction chamber provided with a heating coil. After the inside of the crucible was made to be a vacuum, argon gas was gradually injected to reach the atmospheric pressure, and the pressure was then gradually reduced. In addition, the temperature in the crucible was increased to 2,300° C. Thereafter, an SiC single crystal ingot was grown on the side of the seed crystal without the protective layer for 100 hours at 2,300° C. and 20 torr. As a result, an SiC single crystal ingot having a diameter of 4 to 6 inches was obtained as shown in FIG. 13.

Test Example B1: Evaluation of the Physical Properties of a Protective Layer

The physical properties of the protective layer provided on the seed crystal prepared in Example B1 were evaluated.

The protective layer was measured using a thermal diffusivity measurement device (LFA447, NETZCH) to have a thermal diffusivity of 143 mm$^2$/s. In addition, the protective layer was measured to have a thermal conductivity of 158.5 W/mK, a density of 1.3 g/cm$^3$, and a specific heat of 0.85 J/gK.

Test Example B2: Observation of the Cross-Section of a Protective Layer

The cross-section of the seed crystal provided with a protective layer as prepared in Example B1 was observed and shown in FIGS. 12A to 12C.

In FIGS. 12A to 12C, the left-hand side shows the seed crystal, and the right-hand side shows the protective layer.

In addition, in FIGS. 12A to 12C, what is indicated by the arrows are the first carbonaceous layer, the second carbonaceous layer, and the third carbonaceous layer, respectively.

Thus, it was confirmed that a multilayered protective layer was formed on the rear side of the seed crystal in the Example.

Test Example B3: Evaluation of the Surface of a Protective Layer

The surface of the protective layer provided on the seed crystals prepared in Example B1 and Comparative Example B1 was observed.

In addition, the surface of the protective layer provided on the seed crystal prepared in Example B1 was observed upon the growth of a single crystal ingot. Further, a single crystal ingot was grown according to the procedure of Example B2 using the seed crystal provided with a protective layer prepared in Comparative Example B1, and the surface of the protective layer was then observed.

FIG. 11A(a) is a photograph of the protective layer provided on the seed crystal prepared in Example B1. FIG. 11A(b) is a photograph of the surface of the protective layer upon the growth of a single crystal ingot using the same. In addition, FIG. 11B(a) is a photograph of the protective layer provided on the seed crystal prepared in Comparative Example B1. FIG. 11B(b) is a photograph of the surface of the protective layer upon the growth of a single crystal ingot using the same.

As a result, as shown in FIG. 11A(a), the protective layer prepared in Example B1 had an excellent surface without peeling-off or cracks. In contrast, as shown in FIG. 11B(a), the protective layer prepared in Comparative Example B1 had a poor surface with peeling-off and cracks.

In addition, as shown in FIG. 11A(b), neither holes nor vanishment was observed in the protective layer even after the growth of a single crystal ingot. In contrast, as shown in FIG. 11B(b), the protective layer prepared in the Comparative Example had holes and was observed to have vanishment.

Test Example B4: Evaluation of Cracks on the Surface of a Single Crystal Ingot

For the SiC single crystal ingot obtained in Example B2, the surface of the ingot was observed with the naked eyes or an optical microscope. As a result, no cracks were found on the surface of the ingot.

<Example C> Preparation and Use of a Seed Crystal Provided with a Protective Layer Having a Protrusion Member The materials used in Example C below are as follows:
Binder resin: phenolic resin, KC-5536, Kangnam Chemical Co., Ltd.
Filler: crystalline flake graphite, purity of 80 to 99%, $D_{50}$ of 2.5 μm
Solvent: ethanol, OCI Co., Ltd.
Cellulose substrate: a cotton fabric having a thickness of 60 to 100 m/g, plain-weaved, about 140 μm in thickness
Release film: a PET film coated with silicone, 25 to 100 μm in thickness
Seed crystal of an SiC single crystal: 100 to 150 mm in diameter, a crystal structure of 4H—SiC, 350 to 1,000 μm in thickness
Powder of an SiC raw material: purity of 99.99% or more, $D_{50}$ of 100 μm Example C1: Preparation of a Seed Crystal Provided with a Protective Layer (Having a Protrusion Member)

Step (1): Preparation of a Coating Composition

The binder resin was mixed with the solvent to prepare a solution having a solids content of 5 to 15% by weight, to which about 90 parts by weight of the filler was added per 100 parts by weight of the binder resin. The mixture was further mixed with additives such as a wetting dispersant and a defoaming agent in an amount of 5 parts by weight or less, which was dispersed to obtain a composition.

Step (2): Preparation of a Protective Layer

The coating composition thus prepared was coated on both sides of the cellulose fiber substrate having a thickness of about 140 μm using a roll coating equipment to a total thickness of 2,000 μm, which was molded to a sheet form to prepare a protective film. In addition, upon the molding, a first release film and a second release film were laminated on the first and second sides of the protective layer, respectively.

Thereafter, the protective layer having the release films was cut to conform to the seed crystal.

First, the first release film/protective film/second release film was cut in the form of a circle having a diameter larger than that of the seed crystal to be subsequently attached by about 0.8 inch. Second, the region of the second release film that had the same shape and diameter as those of the seed crystal to be attached was cut out (see FIG. 8(b)).

As a result, the protective layer was cut into a circle having a diameter larger than that of the seed crystal. In such event, the first side of the protective layer was entirely covered by the first release film, and the second surface was exposed to the outside in the region to which the seed crystal was to be attached and was covered by the second release film in the other region (see FIG. 8(c)).

Step (3): Attachment of a Seed Crystal to a Protective Layer

The seed crystal was placed on the second side of the protective layer previously cut such that the rear side of the seed crystal (i.e., the opposite side of the growing side) was brought into contact with the region where the second release film had been removed. Thereafter, the seed crystal on the protective layer was pressed under the conditions of a temperature of 25° C. and a pressure of 0.5 kgf/inch to laminate the protective layer and the seed crystal.

Step (4): Curing and Carbonization of a Protective Layer

The first release film was removed from the protective layer laminated to the seed crystal, which was then dried and cured by thermal treatment in an oven at about 105° C. for 1 hour. Thereafter, the second release film was removed from the protective layer, which was then heated at a rate of 1° C./min to reach 600° C. and then thermally treated for 2 hours to carbonize it.

As a result, a seed crystal provided with a carbonaceous protective layer on the rear side was obtained. In such event, the protective layer had a diameter larger than that of the seed crystal, whereby it covered the entire rear side of the seed crystal and had a protrusion member that protruded outward from the periphery of the seed crystal.

Example C2: Growth of a Silicon Carbide Single Crystal Ingot

Step (1): Placement of a Seed Crystal

A graphite crucible provided with a rack on the upper inner wall was prepared. The SiC powder as a raw material was charged to the lower region of the crucible. In addition, the seed crystal provided with a protective layer as prepared in the above Example C1 was placed on the rack in the crucible. In such event, only the protrusion member of the protective layer was placed on the rack such that the seed crystal did not come into contact with the reaction vessel or the rack (see FIG. 5A). In addition, the side of the seed crystal provided with a protective layer faced the top of the reaction vessel, and the side without a protective layer faced the bottom of the reaction vessel.

Step (2): Growth of a Single Crystal Ingot

The crucible was closed with a lid, wrapped with a heat insulation material, and placed in a reaction chamber provided with a heating coil. After the inside of the crucible was made to be a vacuum, argon gas was gradually injected to reach the atmospheric pressure, and the pressure was then gradually reduced. In addition, the temperature in the crucible was increased to 2,300° C. Thereafter, an SiC single crystal ingot was grown on the side of the seed crystal without the protective layer for 100 hours at 2,300° C. and 20 torr. As a result, an SiC single crystal ingot having a diameter of 4 to 6 inches was obtained.

Test Example C1: Evaluation of the Shrinkage of a Protective Layer

The shrinkage of the protective layer in Example C1 at the time of curing and carbonization was evaluated. As a result, the shrinkage upon curing was within about 2% in the transverse direction as compared with the initial state, and the shrinkage upon carbonization was within about 10% in the transverse direction as compared with the initial state. Thus, the shrinkage was small.

Test Example C2: Evaluation of the Surface and Cross-Section of a Protective Layer The surface and cross-section of the protective layer prepared in Example C1 were observed. As a result, the protective layer prepared in Example C1 was excellent since it had no peeling-off or cracks on the surface as shown in FIG. 14A. The layered structure was clearly confirmed on the cross-section as shown in FIG. 14B. Meanwhile, in FIG. 14A, the curved shape according to the fiber structure of the substrate layer was also observed on the surface of the protective layer.

In addition, the surface of the protective layer provided on the seed crystal prepared in Example C2 was observed upon the growth of a single crystal ingot. As a result, neither holes nor vanishment was observed in the protective layer even after the growth of a single crystal ingot.

Test Example C3: Changes in Quality of a Seed Crystal and an Ingot Upon Growth For the seed crystal upon the growth in Example C2, the quality thereof was observed with the naked eyes or an optical microscope. As a result, no cracks were found on the surface of the ingot.

For the seed crystal and the SiC single crystal ingot, the quality thereof was observed with the naked eyes or an optical microscope. In FIG. 15A, the left-hand side is a photograph of the grown ingot, and the right-hand side is a UV image thereof. As confirmed therefrom, no cracks were found on the surface of the grown ingot in Example C2.

In addition, an ingot was grown using the conventional method shown in FIG. 10A (a seed crystal attached to a holder) as a comparative example. The quality thereof was observed with the naked eyes or an optical microscope. In FIG. 15B, the left-hand side is a photograph of the grown ingot, and the right-hand side is a UV image thereof. As confirmed therefrom, cracks (in the dotted region) caused by internal stress were found on the surface of the grown ingot in the Comparative Example.

The invention claimed is:

1. A process for growing a silicon carbide (SiC) single crystal ingot comprising:
   (1) forming a carbonaceous protective layer on the rear side of a seed crystal of a SiC single crystal;
   (2) charging a SiC raw material to a lower region of a reaction vessel and placing the seed crystal in an upper region of the reaction vessel without adhesion thereto; and
   (3) growing a SiC single crystal ingot on the front side of the seed crystal from the SiC raw material,
   wherein the step (1) comprises:
   molding a composition that comprises a binder resin into a sheet form to prepare a protective layer;
   cutting the protective layer and attaching it to the rear side of the seed crystal of a SiC single crystal by pressure thereon; and
   curing and carbonizing the protective layer attached to the seed crystal to form the carbonaceous protective layer on the rear side of the seed crystal.

2. The process for growing a SiC single crystal ingot of claim 1, wherein the composition includes in addition to the binder resin a filler, and
   wherein the carbonaceous protective layer has a thickness of 5 to 1,000 μm and comprises a carbon-based filler, a metal-based filler, or a composite filler thereof in an amount of 50 to 95% by weight based on the weight of the carbonaceous protective layer.

3. The process for growing a SiC single crystal ingot of claim 1, wherein the composition includes
   a first composition and a second composition, each of which comprises the binder resin and a filler.

4. The process for growing a SiC single crystal ingot of claim 3, wherein the first composition and the second composition are a liquid composition, the first composition has a solids content lower than that of the second composition, and
   the second carbonaceous layer has an amount of a filler greater than that of the first carbonaceous layer.

5. The process for growing a SiC single crystal ingot of claim 1, wherein in the step of preparing the protective layer, the composition is coated on both sides of a core layer composed of a fibrous material, which is then molded to a sheet form.

6. The process for growing a SiC single crystal ingot of claim 1,
   wherein the reaction vessel is provided with a flat rack in an upper region thereof, and wherein the seed crystal is placed on the rack without adhesion thereto.

7. The process for growing a SiC single crystal ingot of claim 1,
   wherein the reaction vessel is provided with a rack in an upper region thereof, and wherein the rack has a groove and the seed crystal is fit in the groove of the rack without adhesion thereto.

8. The process for growing a SiC single crystal ingot of claim 1, wherein the reaction vessel is provided with a rack in an upper region thereof,
   the protective layer has a diameter larger than that of the seed crystal, whereby it covers the entire rear side of the seed crystal and has a protrusion member that protrudes outward from the periphery of the seed crystal, and
   the protrusion member of the protective layer is placed on the rack without adhesion thereto for placing the seed crystal.

9. The process for growing a SiC single crystal ingot of claim 1, wherein the reaction vessel has a structure in which the upper region is open, and the reaction vessel is closed by the seed crystal placed in the upper region of the reaction vessel.

* * * * *